(12) United States Patent
Ma et al.

(10) Patent No.: US 10,741,228 B2
(45) Date of Patent: Aug. 11, 2020

(54) MEMORY DEVICE

(71) Applicant: Tohoku University, Miyagi (JP)

(72) Inventors: Yitao Ma, Miyagi (JP); Tetsuo Endoh, Miyagi (JP)

(73) Assignee: Tohoku University, Miyagi (JP)

( * ) Notice: Subject to any disclaimer, the term of this patent is extended or adjusted under 35 U.S.C. 154(b) by 186 days.

(21) Appl. No.: 16/089,153

(22) PCT Filed: Mar. 27, 2017

(86) PCT No.: PCT/JP2017/012276
§ 371 (c)(1),
(2) Date: Sep. 27, 2018

(87) PCT Pub. No.: WO2017/170340
PCT Pub. Date: Oct. 5, 2017

(65) Prior Publication Data
US 2020/0219547 A1 Jul. 9, 2020

(30) Foreign Application Priority Data

Mar. 28, 2016 (JP) ................................. 2016-064777

(51) Int. Cl.
*G11C 7/00* (2006.01)
*G11C 7/22* (2006.01)
(Continued)

(52) U.S. Cl.
CPC .............. *G11C 7/222* (2013.01); *G11C 15/02* (2013.01); *G11C 15/046* (2013.01); *G11C 2207/2227* (2013.01)

(58) Field of Classification Search
CPC ....... G11C 7/222; G11C 15/02; G11C 15/046; G11C 2207/2227
See application file for complete search history.

(56) References Cited

U.S. PATENT DOCUMENTS

| | | | | |
|---|---|---|---|---|
| 10,643,701 | B2* | 5/2020 | Ma ....................... | G11C 7/1006 |
| 2005/0152167 | A1* | 7/2005 | Nishiyama ............. | G11C 15/00 |
| | | | | 365/49.17 |
| 2013/0114322 | A1* | 5/2013 | Mattausch ............. | G11C 15/04 |
| | | | | 365/49.17 |

FOREIGN PATENT DOCUMENTS

JP 2011076688 A 4/2011
JP 2012190530 A 10/2012
(Continued)

OTHER PUBLICATIONS

Ma, Y., et al., "An MTJ-Based Nonvolatile Associative Memory Architecture with Intelligent Power-Saving Scheme for High-Speed Low-Power Recognition Applications," 978-1-4673-5762-3/13 copyright 2013 IEEE.

(Continued)

*Primary Examiner* — Pho M Luu
(74) *Attorney, Agent, or Firm* — Fox Rothschild LLP; Robert J. Sacco; Carol E. Thorstad-Forsyth

(57) ABSTRACT

A memory device capable of reading reference data while achieving optimization of electric power consumption is provided. A memory device includes a memory area storing reference data of N (≥1) dimensions each composed of M (≥1) bits. A number of memory grains each composed of nonvolatile memory and power drivers paired with the memory grains to supply electrical power to the memory grains are provided in each region specified by column lines in the number and M row lines, the number being one to N inclusive. When the power driver receives a control signal from the corresponding one of the column lines, a control signal from the corresponding one of the M row lines, and a clock signal, the power driver supplies electrical power to the memory grain in synchronization with the clock signal.

23 Claims, 35 Drawing Sheets

(51) Int. Cl.
*G11C 15/04* (2006.01)
*G11C 15/02* (2006.01)

(56) References Cited

FOREIGN PATENT DOCUMENTS

| JP | 2013191255 A | 9/2013 |
|---|---|---|
| JP | 2015016257 A | 1/2015 |
| JP | 2015162257 A | 9/2015 |
| JP | 2015185197 A | 10/2015 |

OTHER PUBLICATIONS

Ohsawa, T., et al., "1 Mb 4T-2MTJ Nonvolatile STT-RAM for Embedded Memories Using 32b Fine-Grained Power Gating Technique with 1.0ns/200ps Wake-up/Power-off Times," 2012 Symposium on VLS Circuits Digest of Technical Papers, 978-1-4673-0849-6/12 copyright 2012 IEEE.

Bui, T.T., et al., "A Scalable Architecture of Associative Processors Employing Nano Functional Devices," 978-1-3233-3706-4/09 copyright 2009 IEEE.

Yang, B. "Low-Power Effective Memory-Size Explanded TCAM Using Data-Relocation Scheme," IEEE Journal of Solid-State Circuits, vol. 50, No. 10, Oct. 2015.

Onizawa, N., et al., "High-Throughput Low-Energy Self-Timed CAM Based on Reordered Overlapped Search Mechanism," IEEE Transactions on Circuits and Systems—I: Regular Papers, vol. 61, No. 3, Mar. 2014.

Ullah, Z., et al., "Z-TCAM: An SRAM-based Architecture for TCAM," IEEE Transactions on Very Large Scale Integration (VLSI) Systems, vol. 23, No. 2, Feb. 2015.

Sasaki, S., et al., "Digital Associative Memory for Word Parrallell Manhattan-Distance-Based Vector Quantization," 978-1-4673-2213-3/23 copyright 2012 IEEE.

Akazawa, T., et al., "Word-Parallel Coprocessor Architecture for Digital Nearest Euclidean Distance Search," 978-1-4799-0645-1/13 copyright 2013 IEEE.

An, F. et al., "A Coprocessor for Clock-Mapping-Based Nearest Euclidean Distance Search with Feature Vector Dimension Adaptability," 978-1-4799-3286-3/14 copyright 2014 IEEE.

An, F., et al., "Associative Memory for Nearest Neighbor Search with High Flexibility of Reference-Vector Number Due to Configurable Dual-Storage Space," Extended Abstracts of the 2015 International Conference on Solid State Device and Materials, Sapporo, 2015, pp. 144-145.

Bui, T.T., et al., "A Scalable Architecture of Associative Processors Employing Nano Functional Devices," 978-1-4244-3705-4/09 copyright 2009 IEEE.

Ohsawa, T., et al., "A 1 Mb Nonvolatile Embedded Memory Using 4T2MTJ Cell with 32 b Fine-Grained Power Gating Scheme," IEEE Journal of Solid-State Circuits, vol. 48, No. 6, Jun. 2013.

Ohsawa, T., et al., "A 1.5nsec,/2.1nsec Random Read/Write Cycle 1Mb STT-RAM Using 6T2MTJ Cell with Background Write for Nonvolatile e-Memories," 2013 Symposium on VLSI Circuits Digest of Technical Papers, 978-4-86348-348-4.

\* cited by examiner

FIG. 23C

| Performance Comparison: | This Work |
|---|---|
| Technology Process | 90nm MTJ/CMOS |
| Circuit Area (Circuit Area/bit) | 660 μm x 345 μm (~ 11 μm² /bit) |
| Number of MTJ | 393K |
| Memory Size | 16Kb |
| Vector Data Format | 8D, 1b, 2048word ~ 128D 128b, 1word |
| Power Supply | 1.0 V |
| Operation Frequency | Clk1 : 12.5 MHz, Clk2 : 50MHz |
| Throughput | 8 cycle/vector (8D) ~ 128 cycle/vector (128D) |
| Average Operation Power Consumption | 130 μW |
| Standby Power Dissipation | 0 |
| Similarity Evaluation Method | Bell-Shape Similarity Evaluation |

BELL-SHAPED SIMILARITY EVALUATE CELL CIRCUIT OPERATION TEST

16-DIMENSIONAL DATA CONFIGURATION
CORE OPERATION WAVEFORM

MEMORY DEVICE

CROSS REFERENCE TO RELATED APPLICATION

The present application is the U.S. national Stage of PCT International Patent Application No. PCT/JP2017/012276 filed on Mar. 27, 2017, which claims priority to Japanese Patent Application No. 2016-064777 filed on Mar. 28, 2016. All of the aforementioned applications are incorporated herein by reference in their entireties.

TECHNICAL FIELD

The present invention relates to a memory device capable of searching for similar data.

BACKGROUND ART

In a typical memory device, data is stored at each address. The address is specified to read data stored in the specified address. In an associative memory device, data similar to input data is searched and read.

A typical associative memory is a content addressable memory (CAM) configured to search a reference data base for data completely matching with search data (refer to Patent Literatures 1 to 3 and Non Patent Literatures 1 to 3, for example). The CAM, which operates completely in parallel, includes a memory cell and a comparison circuit at each memory cell. The comparison circuit compares input data with reference data in the memory cell. The CAM searches fast for reference data matching with a specified destination IP address or MAC address. However, the CAM is useful for searching for an IP address at a network router, but is not suitable for searching for similar data.

One of technologies of searching for similar data is an associative memory having a nearest neighbor search (NNS) function. The associative memory is achieved in a digital approach (refer to Patent Literatures 4 and 5 and Non Patent Literatures 4 to 7, for example) or an analog approach (refer to Non Patent Literature 8, for example). In each approach, a region in which reference data is stored is provided by a volatile SRAM.

The group of the inventors have developed the technology of a spin transfer torque-magnetoresistance random access memory (STT-MRAM) as a nonvolatile memory (refer to Non Patent Literatures 9 and 10, for example).

CITATION LIST

Patent Literature

Patent Literature 1: Japanese Patent Laid-open No. 2012-190530
Patent Literature 2: Japanese Patent Laid-open No. 2013-191255
Patent Literature 3: Japanese Patent Laid-open No. 2015-185197
Patent Literature 4: Japanese Patent Laid-open No. 2011-76688
Patent Literature 5: Japanese Patent Laid-open No. 2015-16257

Non Patent Literature

Non Patent Literature 1: B.-D. Yang, JSSC, Vol 50, No. 10, pp. 2441-2450, October 2015
Non Patent Literature 2: N. Onizawa, S. Matsunaga, V. C. Gaudet, W. J. Gross and T. Hanyu, IEEE Trans. Circuits and Systems, Vol. 61, No. 3, pp. 865-876, March 2014
Non Patent Literature 3: Z. Ullah, M. K. Jaiswal and R. C. C. Cheung, IEEE Trans. VLSI Systems, Vol. 23, No. 2, pp. 402-406, February 2015
Non Patent Literature 4: S. Sasaki, M. Yasuda and H. J. Mattausch, ESSCIRC, pp. 185-188, 2012
Non Patent Literature 5: T. Akazawa, S. Sasaki and H. J. Mattausch, ESSCIRC, pp. 267-270, 2013
Non Patent Literature 6: F. An, T. Akazawa, S. Yamazaki, L. Chen, and H. J. Mattausch, CICC, pp. 1-4, 2014
Non Patent Literature 7: F. An, K. Mihara, S. Yamasaki, L. Chen and H. J. Mattausch, SSDM, pp. 144-145, 2015
Non Patent Literature 8: T. B. Trong and T. Shibata, ULIS, pp. 213-216, 2009
Non Patent Literature 9: Takashi Ohsawa, Hiroki Koike, Sadahiko Miura, Hiroaki Honjo, Keizo Kinoshita, Shoji Ikeda, Takahiro Hanyu, Hideo Ohno, Tetsuo Endoh, A 1 Mb Nonvolatile Embedded Memory Using 4T2MTJ Cell With 32$b$ Fine-Grained Power Gating Scheme, IEEE JOURNAL OF SOLID-STATE CIRCUITS, VOL. 48, NO. 6, JUNE 2013, pp. 1511-1520
Non Patent Literature 10: T. Ohsawa, S. Miura, K. Kinoshita, H. Honjo, S. Ikeda, T. Hanyu, H. Ohno, and T. Endoh, A 1.5 nsec/2.1 nsec Random Read/Write Cycle 1MbSTT-RAM Using 662MTJ Cell with Background Write for Nonvolatile e-Memories, 2013 Symposium on VLSI Circuits Digest of Technical Papers C111

SUMMARY OF INVENTION

Technical Problem

Since NNS associative memories in the digital and analog approaches are volatile memories, all memory grains need to be supplied with electrical power at data reading from any region. Thus, electric power consumption cannot be reduced.

Thus, it is an object of the present invention to provide a memory device capable of reading reference data while achieving optimization of electric power consumption when searching for data similar to search data.

Solution to Problem

To achieve the object, the present invention includes the following concepts.

[1] A memory device including a memory area configured to store reference data of N ($\geq 1$) dimensions each composed of M ($\leq 1$) bits, in which:

an optional number of memory grains each composed of nonvolatile memories of M bits and power drivers paired with the memory grains and configured to supply electrical power to the memory grains in the optional number are provided in each region specified by column lines in the optional number and M row lines in the memory area, the optional number being one to N inclusive, and the reference data per dimension stored in the memory grain paired with each power driver is read when the power driver receives inputting of a control signal from the corresponding one of the column lines in the optional number, inputting of a control signal from the corresponding one of the M row lines, and inputting of a clock signal, and supplies electrical power to the memory grain in synchronization with the clock signal.

[2] The memory device according to [1], in which the inputting of control signals from the M row lines is sequentially performed for each set of row lines in a predetermined number of one to M.

[3] The memory device according to [1], in which the inputting of control signals from the M row lines is simultaneously performed.

[4] The memory device according to any one of [1] to [3], in which each power driver does not supply electrical power to the corresponding one of the memory grains in the optional number that is paired with the power driver when having received inputting of a clock signal of "1" or "0", and supplies electrical power to the corresponding one of the memory grains in the optional number that is paired with the power driver to read the reference data stored in the memory grain when having received inputting of a clock signal of "0" or "1".

[5] The memory device according to any one of claims 1 to 4, further including:

a first circuit configured to calculate a similarity between each read reference data per dimension and search data per dimension at each reading from the memory area;

and a second circuit configured to determine a candidate having a high similarity among the similarities calculated by the first circuit and calculate the similarity of most similar reference data per dimension at the reading from the memory area.

[6] The memory device according to any one of [1] to [5], in which the nonvolatile memory is a magnetoresistive random access memory, a resistive random access memory, a ferroelectric random access memory, or a flash memory.

Advantageous Effects of Invention

According to the present invention, firstly, a memory area configured to store reference data of N ($\geq 1$) dimensions each composed of M ($\geq 1$) bits is provided; secondly, an optional number of memory grains each composed of nonvolatile memories of M bits and power drivers paired with the memory grains and configured to supply electrical power to the memory grains in the optional number are provided in each region specified by column lines in an optional number of one to N inclusive and M row lines in the memory area; and thirdly, the reference data per dimension stored in the memory grain paired with each power driver is read when the power driver receives inputting of a control signal from the corresponding one of the column lines in the optional number, inputting of a control signal from the corresponding one of the M row lines, and inputting of a clock signal, and supplies electrical power to the memory grain in synchronization with the clock signal. Accordingly, each memory grain is supplied with electrical power through specification of a reading place by the column line and the row line and temporal specification by the clock signal, which leads to power saving.

BRIEF DESCRIPTION OF DRAWINGS

FIG. 23C is a table listing designing specifications in the implementation example illustrated in FIG. 12.

DESCRIPTION OF EMBODIMENT

Some embodiments of the present invention will be described below in detail with reference to the accompanying drawings.

Figure 1:
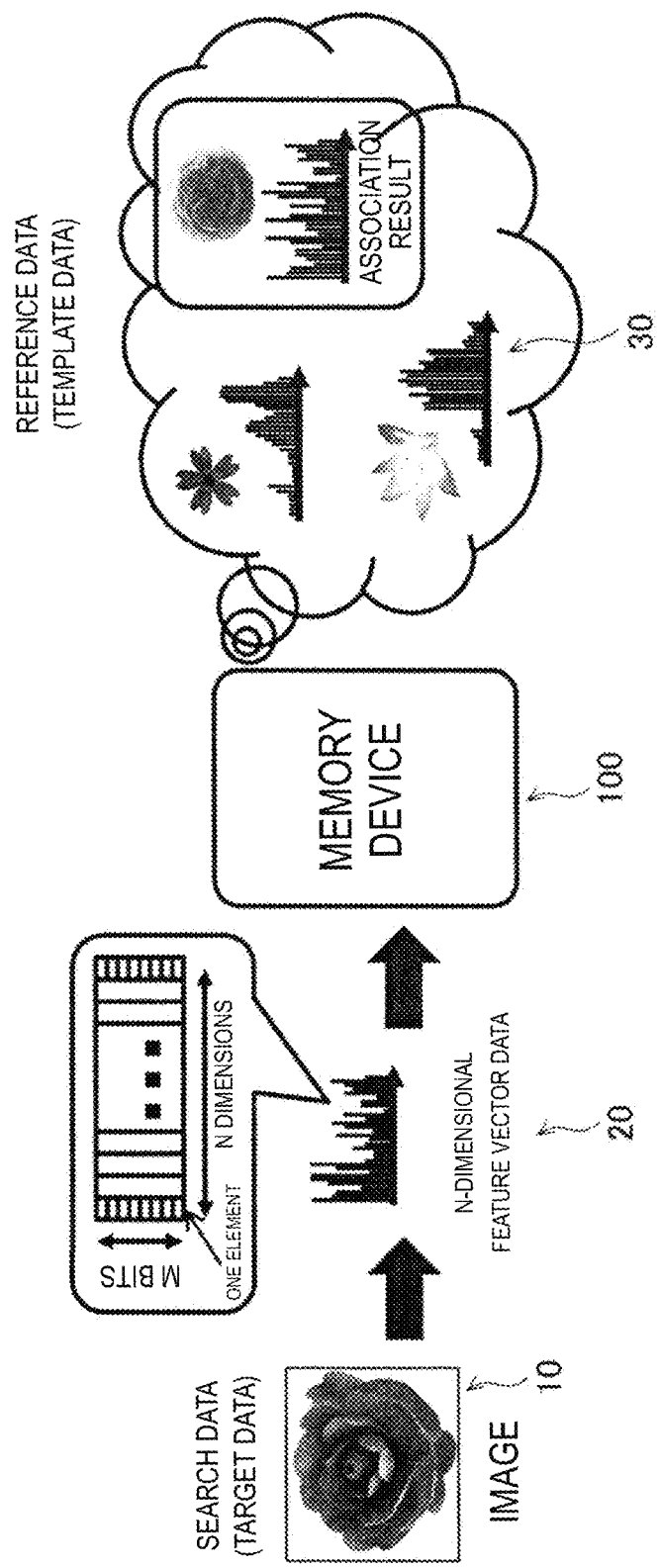
FIG. 1 is a diagram for description of a case to which a memory device according to an embodiment of the present invention is applied.

FIG. 1 is a diagram for description of a case to which a memory device 100 according to an embodiment of the present invention is applied. As illustrated in FIG. 1, when search data 10 is input, the search data 10 is converted into feature vector data 20 of one or a plurality of dimensions. The converted data includes the feature vector data 20 of N ($\geq 1$) dimensions each composed of M ($\geq 1$) bits. The memory device 100 extracts most similar data from among stored reference data 30. The memory device 100 includes a memory area as described later.

The following describes the search data 10, the feature vector data 20, and the reference data 30.

The search data 10 is also called target data, and is input as data to be searched from among data stored in the memory area.

The reference data 30 is also called template data, and is stored in the memory area and searched based on the search data.

The search data 10 and the reference data 30 are each image data, sound data, or text data (sentence data) of any kind. The natural numbers M and N are set in accordance with the kind of data to be handled.

The feature vector data 20 is obtained by extracting N ($\geq 1$) feature amounts based on a large number of viewpoints and displaying a vector of ratios of the N feature amounts, each ratio of one feature amount being expressed in a number (this number is expressed in M bits). The number of feature amounts is referred to as a dimension number.

Figure 2:
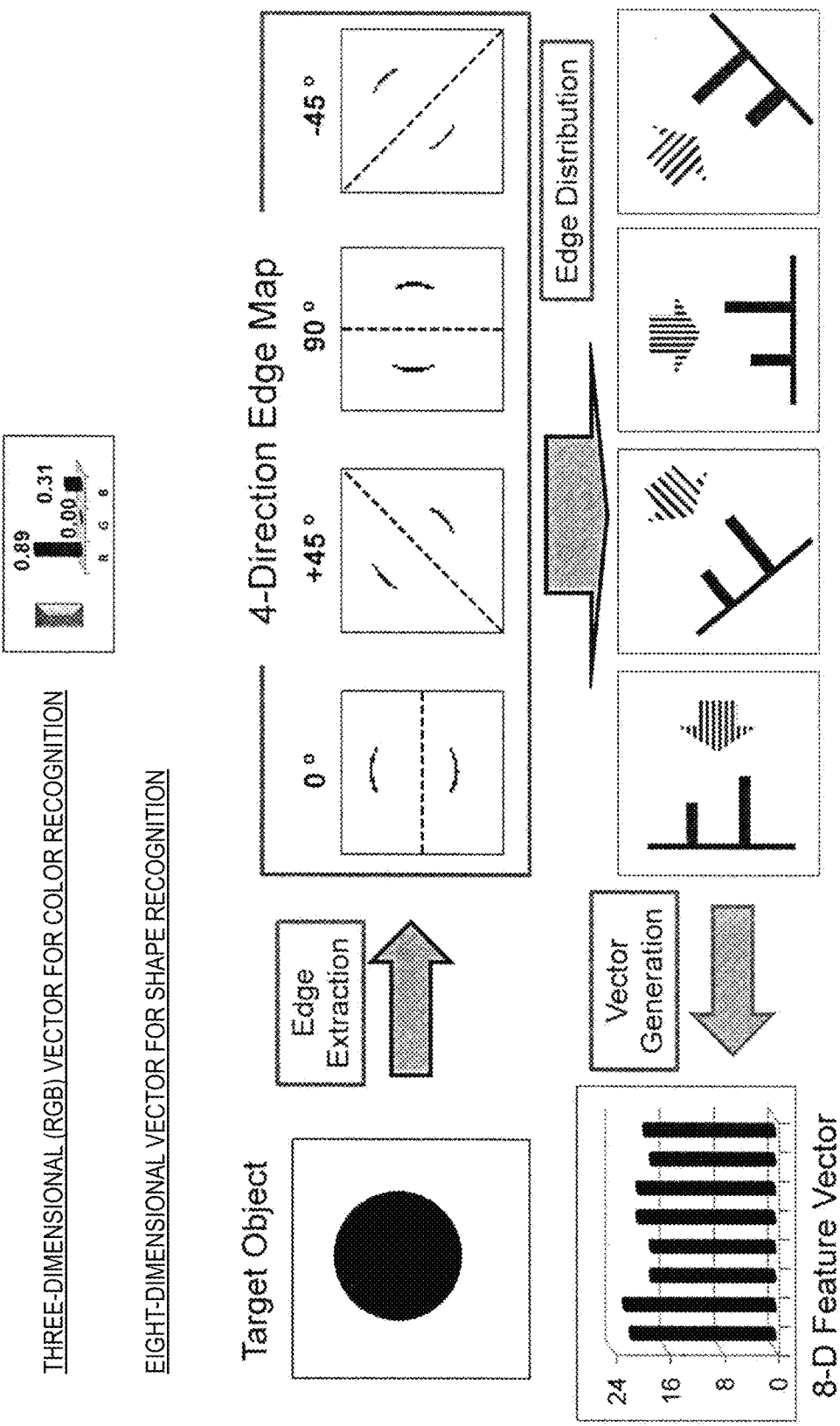
FIG. 2 is an explanatory diagram of feature vector data.

FIG. 2 is an explanatory diagram of the feature vector data 20.

As illustrated in an upper part of FIG. 2, for example, a three-dimensional (RGB) vector data for color recognition indicates the ratio of each color of RGB included in search data. One-dimensional feature is expressed in M (for example, M=8) bits.

As illustrated in a lower part of FIG. 2, for example, eight-dimensional vector data for shape recognition is obtained by determining whether an outline included in the search data 10 includes a part extending along each reference outline as illustrated in "4-Direction Edge Map", counting, by the numbers of pixels, the part extending along the reference outline as illustrated in "Edge Distribution", producing distribution of the numbers of pixels in each component divided by a dotted line at 0°, 45°, 90°, or −45°, and expressing a distribution as an eight-dimensional feature vector ("8-D Feature Vector") as illustrated in "Vector Generation".

The feature vector data 20 is not limited to simple data as illustrated in FIG. 2 but may be complicated feature vector data such as 128-dimensional scale-invariant feature transform (SIFT) vector data and Bag-of-feature (Bof) vector data, which are extremely famous in the field of image recognition.

A memory grain is a memory subarray storing one-dimensional part (M bits) of the reference data 30. In the embodiment of the present invention, independent power source control (ON/OFF) is achieved by performing fine-grain power gating on the memory grain.

In the embodiment of the present invention, data of M bits for each dimension number is stored as reference data in the memory area.

Figure 3:
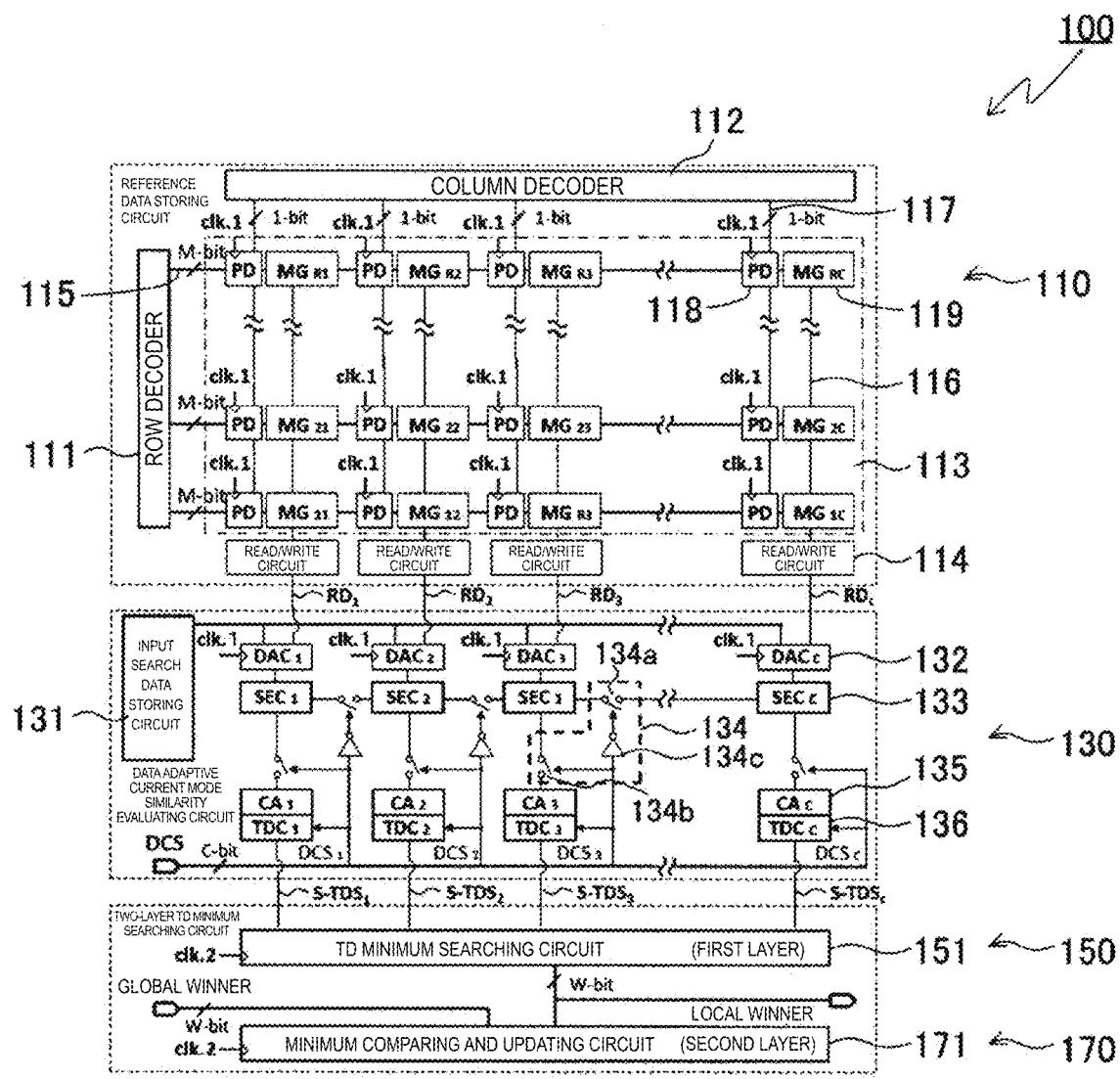
FIG. 3 is a configuration diagram of the memory device according to the embodiment of the present invention.

FIG. 3 is a configuration diagram of the memory device according to the embodiment of the present invention. The memory device 100 according to the embodiment of the present invention is also referred to as a nonvolatile memory device for similarity search, and includes a memory unit 110, a similarity evaluating unit 130, a searching unit 150, and a comparing and updating unit 170.

The memory device 100 according to the embodiment of the present invention includes a reference data storing circuit composed of a memory cell array as the memory unit 110 having (R×M) rows and C columns and storing (R×C)/N pieces of reference data, C similarity evaluation cells (SEC) 133 configured to calculate similarities between respective C/N pieces of the reference data and search data in parallel and output the similarities as electric current, a current accumulator (CA) 135 configured to accumulate the C similarity currents in accordance with the dimension number of the reference data, a time-domain convertor (TD) 136 configured to convert the accumulated similarity currents into C/N time-domain voltage delay signals, a TD minimum searching circuit 151 configured to detect a shortest delay from the C/N time domain voltage delay signals and convert the shortest delay into a minimum number of clocks through a counter, and a minimum comparing and updating circuit 171 configured to compare the minimum number of clocks thus obtained with the number of clocks calculated in advance and stored and update the smaller number of clocks.

The reference data storing circuit as the memory unit 110 includes R×C (C≥N) memory grains (MG) 119 configured to store one-dimensional data, and each memory grain 119 stores an M-bit value. A power driver (PG) 118 for power gating is installed at each memory grain 119, and independently controls electrical power supply through a row decoder, a column decoder, and clock 1 (clk.1). Accordingly, C/N pieces of reference data are stored in the memory grains 119 (MG) on one row and output to the similarity evaluation cells 133 in parallel to execute associative recognition.

The following describes the memory device 100 illustrated in FIG. 3 further in detail.

The reference data storing circuit as the memory unit 110 includes a row decoder 111, a column decoder 112, the memory area 113, and a read/write circuit 114. The memory area 113 includes a plurality of row lines 115, a plurality of bit lines 116, a plurality of column lines 117, a plurality of the power drivers (PD) 118, a plurality of the memory grains (MG) 119. Each memory grain 119 is composed of a nonvolatile memory.

The row decoder 111 is connected with the plurality of row lines 115, and the column decoder 112 is connected with the plurality of column lines 117.

The memory area 113 is divided into a plurality of regions. Each region is specified by the column lines 117 in an optional number of one to N inclusive and the M row lines 115, and provided with a pair of the corresponding power driver 118 and memory grain 119. The optional number of the column lines 117, the number of the row lines 115, and the number of the bit lines 116 are set at designing and manufactured in accordance with the settings. The "optional number" includes a number determined by a user of the memory device or a constant value simply determined at designing and manufacturing. In FIG. 3, each region includes one of the column lines 117, M of the row lines 115, and M of the bit lines 116. The natural numbers M and N are defined in the same manner for the search data 10 and the reference data 30 described above. Each region includes one to N pairs of the power drivers 118 and the memory grains 119.

In the embodiment of the present invention, the memory grains 119 each composed of nonvolatile memories of M bits and the power drivers 118 paired with the memory grains 119 and configured to supply electrical power to the memory grains 119 are provided in each region specified by the column lines 117 in the optional number and the M row lines 115 in the memory area 113. The column lines 117 in the optional number are provided in each region. The "optional number" includes a number determined by the user of the memory device or a constant value simply determined at designing and manufacturing. The optional number of the column lines 117 is equal to the optional number of the memory grains 119 for each region, and is equal to one in FIG. 3.

In the embodiment of the present invention, each power driver 118 receives inputting of a control signal from each of the column lines 117 in the optional number, inputting of a control signal from each of the M row lines 115, and inputting of a clock signal, and supplies electrical power to the memory grain 119 paired with the power driver 118 in synchronization with the clock signal. Accordingly, the reference data of each dimension stored in the memory grain 119 is read and output to the read/write circuit 114 at the corresponding column through the bit lines 116.

Accordingly, electrical power is supplied not to the entire memory area 113 but to the memory grain 119 of each region to be read, and thus electrical power is supplied only to a necessary place only in a necessary time through inputting of the clock signal. This leads to significant reduction of electric power consumption at reading of the reference data stored in the memory area 113.

As illustrated in FIG. 3, the memory grains 119 are provided in an R×C matrix of $MG_{11}$ to $MG_{RC}$. With this configuration, when one or a plurality of the power drivers 118 are specified by one or a plurality of the row lines 115 to which a control signal flows from the row decoder 111 and one or a plurality of the column lines 117 to which a control signal flows from the column decoder 112, and clock signal "1" is input to each specified power driver 118, electrical power is supplied from the power driver 118 to the memory grain 119 paired with the power driver 118 only during the inputting. When clock signal "0" is input to the specified power driver 118, supply of electrical power to the memory grain 119 paired with the power driver 118 is stopped. Alternatively, the power driver 118 may supply the electrical power to the memory grain 119 paired with the power driver 118 when clock signal "0" is input to the power driver 118, and the power driver 118 may supply no electrical power to the memory grain 119 paired with the power driver 118 when clock signal "1" is input to the power driver 118. The clock signals "0" and "1" correspond to "H" and "L".

The inputting of control signals from the M row lines 115 may be sequentially performed for each set of row lines in a predetermined number of one to M or may be simultaneously performed for the first to M-th row lines.

The memory device 100 illustrated in FIG. 3 includes a similarity evaluating unit 130 as a first circuit, and includes the searching unit 150 and the comparing and updating unit 170 as a second circuit. The first circuit calculates the similarity between each read reference data per dimension and search data per dimension at each reading from the memory area 113. The second circuit determines a candidate having a high similarity calculated by the first circuit and calculates the similarity of most similar reference data per dimension at the reading from the memory area 113. The following description will be made with an example in which the first circuit and the second circuit have specific configurations illustrated in FIG. 3.

The similarity evaluating unit 130 includes an input search data storing circuit 131, a digital analog convertor (DAC) 132, a similarity evaluation cell (SEC) 133, a switch 134, a current accumulator (CA) 135, and a time-domain convertor (TDC) 136.

The numbers of the digital analog convertors 132, the similarity evaluation cells 133, the switches 134, the current accumulators 135, and the time-domain convertors 136 thus provided are equal to the number of column lines. At each column, digital data as a voltage value is input from the read/write circuit 114 to the digital analog convertor 132, converted into analog data by the digital analog convertor 132, and output to the similarity evaluation cells 133.

The similarity evaluation cells 133 calculate the similarity between two input data. The first data is data obtained by disassembling search data into each dimension and output from the input search data storing circuit 131, and is a voltage value of the search data of the dimension. The second data is a voltage value of reference data input from the read/write circuit 114 through the digital analog convertor 132.

The similarity evaluation cells 133 calculate the similarity between the first data and the second data as a current value and output the current value. The first data and the second data are evaluated to be identical when the current value is zero. The first data and the second data are evaluated to be different from each other when the current value is large. Thus, the output current value is small when the reference data is similar to the search data.

The switch 134 is provided at each column. The switch 134 is achieved by cooperation of a first switch 134a and a second switch 134b. The first switch 134a is provided between the similarity evaluation cell 133 at the j-th column and the similarity evaluation cell 133 at the (j+1)-th column. The index j is a natural number of one to the maximum column number C inclusive. The second switch 134b is provided between the similarity evaluation cell 133 and the current accumulator 135 at each column. The first switch 134a and the second switch 134b are each controlled by an external dimension control signal (DCS). A wire through which the external dimension control signal is input is connected with any one of a control electrode of the first switch 134a and a control electrode of the second switch 134b, and a NOT circuit 134c is provided on the wire. With this configuration, the second switch 134b is off when the first switch 134a is on, or the second switch 134b is on when the first switch 134a is off. The dimension control signal controls the switch 134 in accordance with the dimension of reference data stored in the memory area 113.

When N-dimensional reference data is stored in a dimensionally divided manner in the memory grain $MR_{i,j}$ to the memory grain $MR_{i,j+n-1}$, similarities at the similarity evaluation cell $SEC_j$ at the j-th column to the similarity evaluation cell $SEC_{j+n-1}$ at the (j+n-1)-th column need to be added to evaluate whether the N-dimensional reference data is similar to search data.

In the embodiment of the present invention, to add the similarities, the first switch 134a is provided between the similarity evaluation cell $SEC_j$ at the j-th column and the similarity evaluation cell $SEC_{j+1}$ at the (j+1)-th, and the second switch 134b is provided between the similarity evaluation cell $SEC_j$ at the j-th column and the current accumulator $CA_j$ at the j-th column.

N of the similarity evaluation cells 133 are connected in series through the first switches 134a in response to the external dimension control signal. Voltages of search data of the respective dimensions are applied to input terminals of the corresponding similarity evaluation cells 133, and current values output from the similarity evaluation cells 133 are input to and temporarily stored in the current accumulator 135. Thereafter, voltages of reference data of the respective dimensions are applied to the input terminals of the corresponding similarity evaluation cells 133, and current values output from the similarity evaluation cells 133 are input to the corresponding current accumulators 135 to calculate differences with the current values stored therein. In this manner, whether the reference data dispersively stored in a plurality of columns is similar to the search data can be determined based on current values through cooperation of the similarity evaluation cells 133 and the current accumulator 135.

Each time-domain convertor 136 converts the current value output from the corresponding current accumulator 135 into a delay time. Thus, the current value is input to the time-domain convertor 136 from the rightmost similarity evaluation cell 133 having the largest column number among the similarity evaluation cells 133 connected in series through the switches 134. Accordingly, whether the reference data dispersively stored in the plurality of columns is similar to the search data can be determined based on a time delay value. The time delay value decreases as the similarity increases. Each converted delay time signal is input to the searching unit 150.

The searching unit 150 includes the TD minimum searching circuit 151, and searches for the shortest time delay, in other words, the time-domain minimum value from among the time delay signals input from the respective time-domain convertors 136 at the similarity evaluating unit 130. The searched shortest delay time is counted by a W-bit counter and output to the comparing and updating unit 170.

The comparing and updating unit 170 includes the minimum comparing and updating circuit 171, and at each repetition of reading from the memory unit 110, compares the count value input from the searching unit 150 with a count value stored in the comparing and updating unit, and stores the smaller count value. Accordingly, when the repetition of reading from the memory unit 110 ends, a small count value is determined, and as a result, the count value of reference data most similar to the search data is determined. The address of the most similar reference data in the memory unit 110 is obtained by associating the count value with an address at the memory unit 110.

Operation of the memory device 100 illustrated in FIG. 3 will be described below.

First, the input search data storing circuit 131 divides input search data into data of each dimension, converts each divided data into an analog voltage through the digital analog convertor 132, and inputs the analog voltage to the corresponding similarity evaluation cell 133.

Subsequently, one-dimensional reference data (M bits) output from the C memory grains 119 through the read/write circuits 114, respectively, is converted into analog voltages at the digital analog conversion circuits 132 and input to the C similarity evaluation cells 133 in parallel after the inputting of the search data. When the digital analog convertors 132 are serial, conversion of M-bit data takes a time of M clocks.

Then, first, each similarity evaluation cell 133 outputs, as a current for the corresponding dimension, the similarity between the voltage of the search data (one-dimensional) and the voltage of the reference data (one-dimensional).

Subsequently, each first switch 134a between the similarity evaluation cells 133 are controlled to turn on in accordance with the dimension number of the reference data and the search data in response to an external dimension control signal to add currents from the similarity evaluation cells 133 between which the first switch 134a is on, and the currents from the C similarity evaluation cells 133 are accumulated at the C/N similarity current accumulation circuits 135 and outputs to the corresponding time-domain convertors 136. A smaller current indicates a higher similarity. The same dimension control signal turns off the second switches 134b to avoid and deactivate unnecessary connection between the similarity current accumulation circuit 135 and the time-domain convertor 136.

Subsequently, the time-domain convertors 136 convert the accumulated C/N similarity currents into time domain voltage delay signals, and output the signals to the TD minimum searching circuit 151 in parallel.

Subsequently, in minimum searching processing at a first level (local), the TD minimum searching circuit 151 determines a time domain voltage delay signal having the highest similarity, in other words, the shortest delay among the time domain voltage delay signals corresponding to C/N pieces of the reference data per row, and the delay is converted into a digital value as the number of clocks in the delay through the W-bit counter and output to the minimum comparing and updating circuit 171. The W-bit counter is converted into a time domain voltage delay signal having a delay of $2^W$ clocks at maximum, and the resolution of similarity current conversion proportional to this maximum delay is obtained. Thus, a smaller similarity current difference can be obtained with a larger W.

Subsequently, in minimum searching processing at a second level (global), the minimum comparing and updating circuit 171 compares, with values of at all steps stored in the circuit, a digital delay value of a winner (local winner) obtained at a main core 210 or a digital delay value of a winner (global winner) obtained at a branch core 220 and input, and then updates the smaller value by rewriting. Through repetition of this updating, a most similar piece among all pieces of reference data in the main core 210 and the branch core 220 is lastly stored in the minimum comparing and updating circuit 171 as an association processing result. The main core 210 and the branch core 220 will be described below in detail with reference to FIG. 8.

Figure 4:
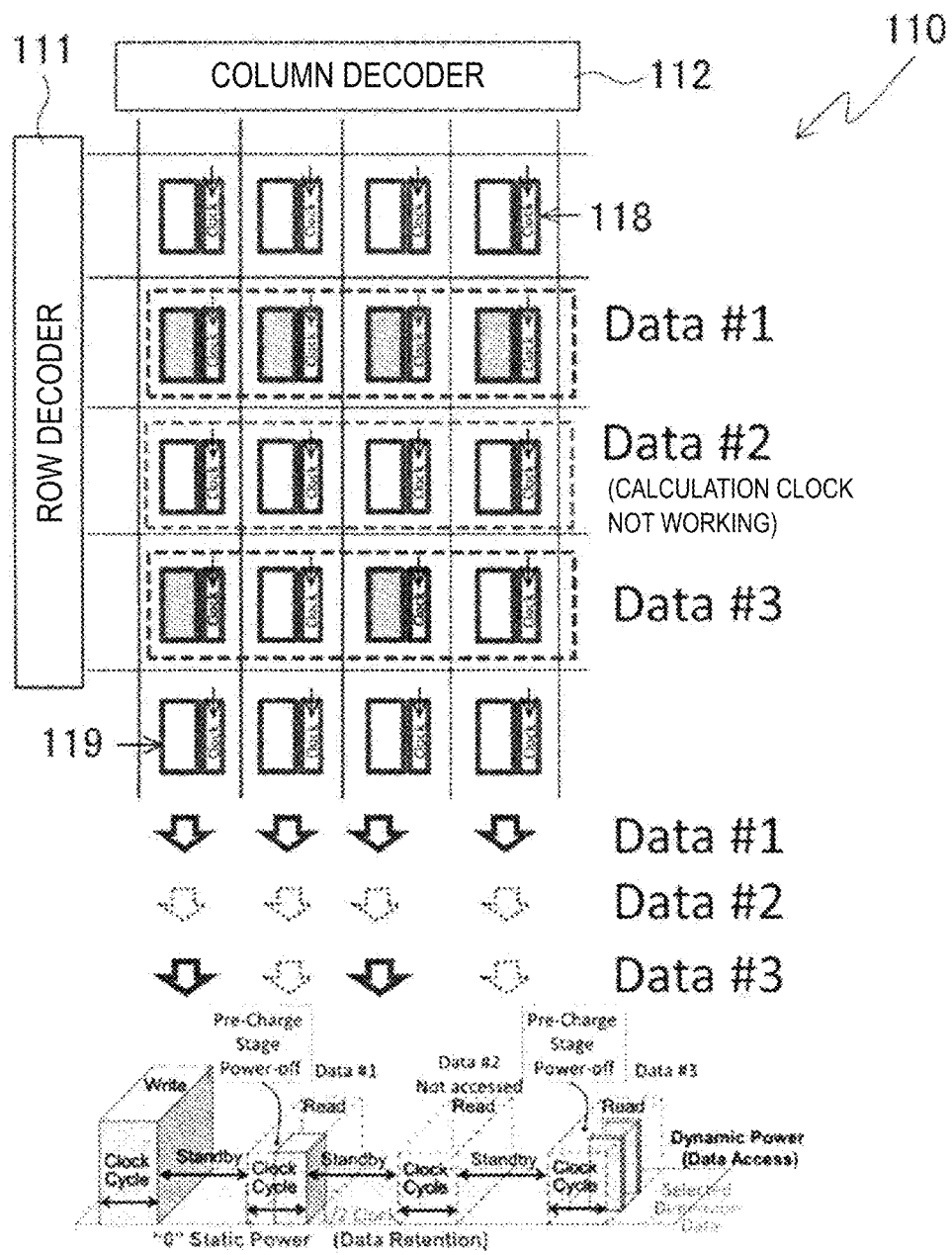
FIG. 4 is a diagram schematically illustrating a memory unit in the memory device according to the embodiment of the present invention and operation and electric power consumption thereof.
Figure 5:
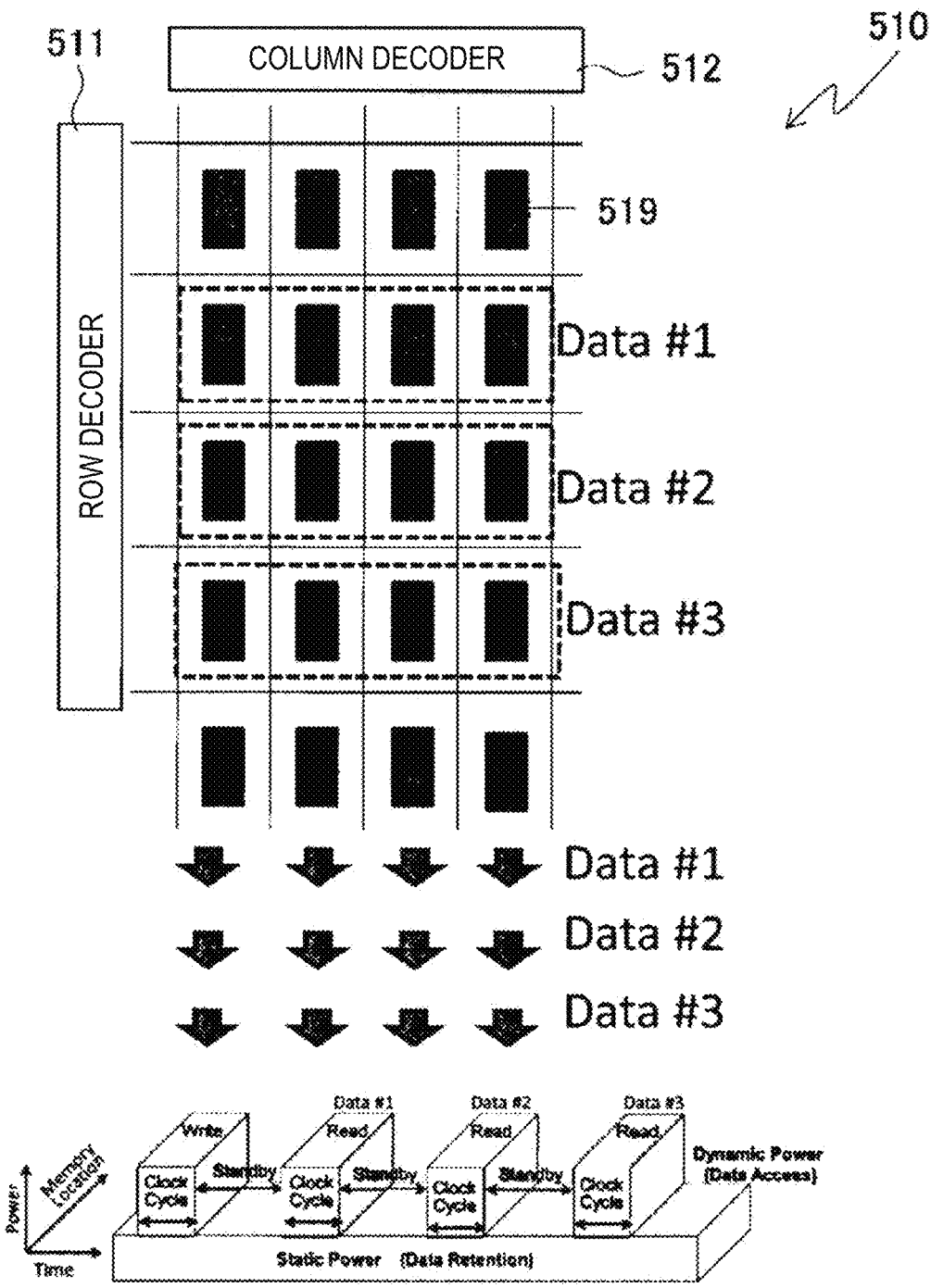
FIG. 5 is a diagram schematically illustrating a memory unit 510 in a conventional approach and operation and electric power consumption thereof.
Figure 6:
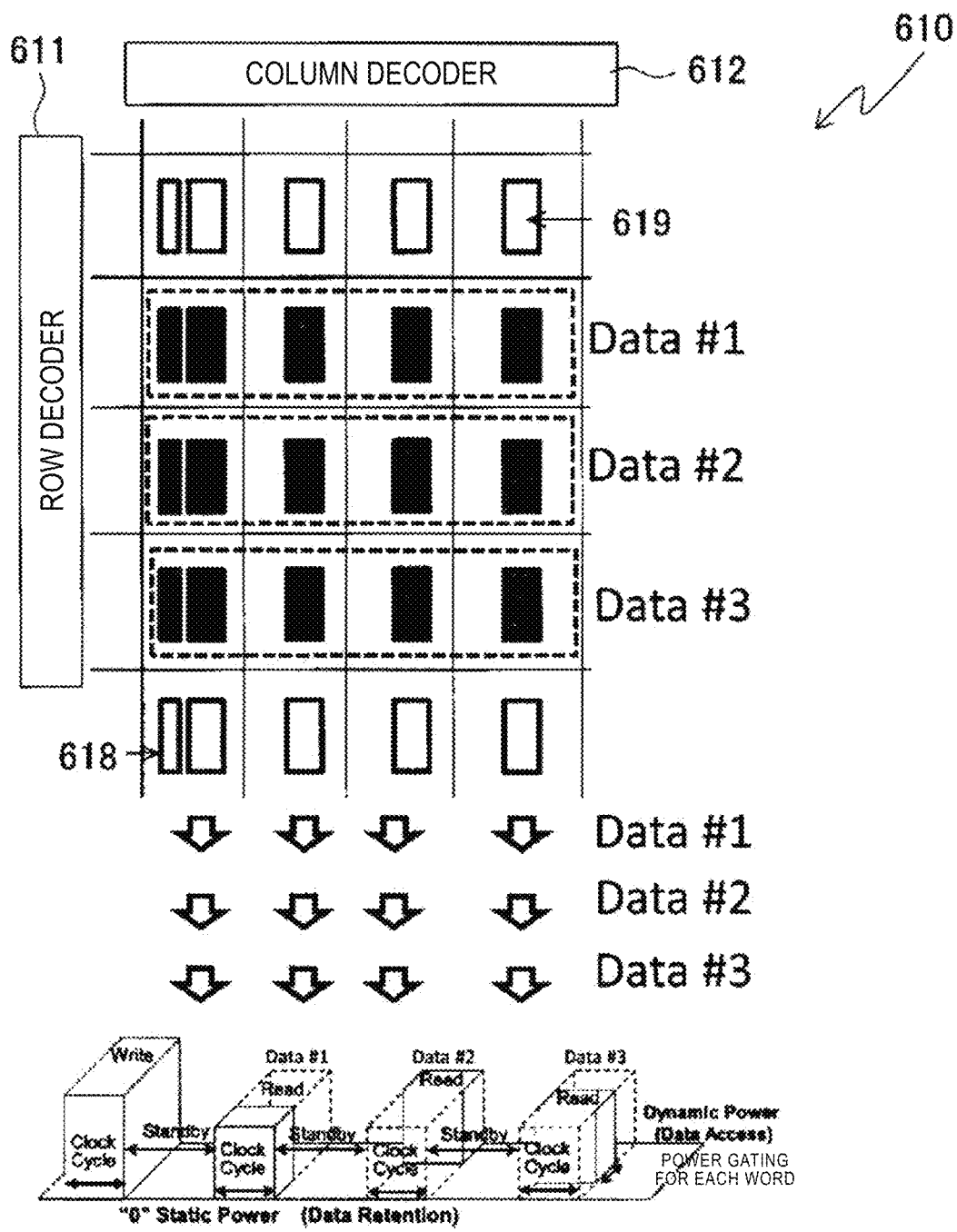
FIG. 6 is a diagram schematically illustrating a memory unit composed of a conventional STT-MRAM and operation and electric power consumption thereof.

The following describes power saving achieved in the memory device 100 according to the embodiment of the present invention in detail. FIGS. 4 to 6 are diagrams for comparing the memory unit and operation and electric power consumption thereof in the memory device according to the embodiment of the present invention with those of a conventional technology.

FIG. 4 is a diagram schematically illustrating the memory unit 110 and operation and electric power consumption thereof in the memory device 100 according to the embodiment of the present invention. The upper part of FIG. 4 schematically illustrates the memory unit 110. The middle part of FIG. 4 illustrates regions at columns from which data is read when Data #1, Data #2, and Data #3 are sequentially read at each column. In the lower part of FIG. 4, the horizontal axis represents time, the vertical axis represents electric power consumption, and the depth axis represents the position of a memory grain.

The power drivers 118 are provided for the respective dimensions of reference data (respective memory grains) to allow simultaneous activation of a plurality of optional column lines 117 as well as fine-grain power gating so that electrical power is flexibly supplied only to a necessary memory grain 119 corresponding to each necessary data dimension in one Data. In addition, an operation calculation clock signal is input to each power driver 118 so that electrical power is supplied from the power driver 118 to the corresponding memory grain 119 in synchronization with the clock signal.

Through this reading control, electrical power is consumed only when data necessary for calculation is in a calculation operation, and not when no clock signal of calculation operation is input. Moreover, electrical power is consumed only when a clock pulse is "0" at reading. When the clock pulse is "1" (in the first half of a clock), the bit line 116 is pre-charged to 0 V, and thus no electrical power needs to be supplied, which halves electric power consumption in the calculation operation.

For example, as for Data #1, electric power consumption is halved at reading when data output is necessary for all dimensions of reference data because a clock is used. This is because of the following reason. By introducing clock control, the memory grains 119 are supplied with no electrical power but pre-charged in the first half of a clock, in other words, when a clock signal is "H". A specified memory grain is supplied with electrical power to read data in the second half of a clock, in other words, when a clock signal is "L". This pre-charge prevents occurrence of "disturb" false operation when electrical power supply is switched at high speed, and thus data is not rewritten when the reference data is read.

As for Data #2, an operation calculation clock is controlled so that the power drivers 118 are not operated, and thus memory operation dynamically stops, which leads to minimization of electric power consumption.

As for Data #3, when output is necessary for some dimensions of reference data, electrical power is supplied only to a minimum necessary number of the memory grains 119, thereby achieving optimization of electric power consumption.

In the embodiment of the present invention, the memory unit 110 is composed of a nonvolatile memory based on cycle-based fine-grain controllable power gating. With this configuration, electric power consumption is zero at standby, and electrical power is supplied to a necessary part of the memory unit 110 but not to an unnecessary part, thereby reducing electric power consumption.

Nonvolatile memories have been developed with focus on various different specifications such as small area, fast speed, high stability, and low write current. In this example, a fast and stable nonvolatile memory cell is needed to achieve cycle-based fine-grain controllable power gating. In the embodiment of the present invention, typically, a differential-pair STT-MRAM memory cell is preferably used. This will be described later in detail in an implementation example.

As described later in the implementation example, searching can be performed at high speed and cycle-based fine-grain controllable power gating can be achieved because of the following reasons.

The first reason is that a differential-pair STT-MRAM memory cell (for example, 4T-2MTJ cell), which is capable of responding swiftly at electrical power supply and performing fast and stable operation, is employed. The 4T-2MTJ cell is characterized in that it can perform faster data reading from MTJ and causes no "disturb" false operation due to fast on and off operations of a power source.

The second reason is that bit lines are pre-charged to 0 V before electrical power supply to avoid accumulation of unnecessary electric charge and hence allow data reading at high speed.

According to the embodiment of the present invention, significantly low electrical power consumption at an associative memory can be achieved by employing a nonvolatile memory device based on cycle-based fine-grain controllable power gating. The system is reconstructed in accordance with the dimension number of data through the switches 134 of the similarity evaluating unit 130, and the nonvolatile memory device based on cycle-based fine-grain controllable power gating supplies electrical power to a minimum necessary number of memories in accordance with the reconstruction, thereby optimizing electric power consumption at operation.

The following describes memory units of a conventional NNS associative memory in a digital approach and an analog approach (hereinafter referred to as "conventional approach"). FIG. 5 is a diagram schematically illustrating a memory unit 510 in the conventional approach and operation and electric power consumption thereof. The upper part of FIG. 5 schematically illustrates the memory unit 510. The middle part of FIG. 5 illustrates regions at columns from which data is read when Data #1, Data #2, and Data #3 are sequentially read at each column. In the lower part of FIG. 5, the horizontal axis represents time, the vertical axis represents electric power consumption, and the depth axis represents the position of a memory grain.

In the conventional approach, the memory area of the memory unit 510 is composed of a volatile SRAM. Thus, when reference data is written to all memory grains 519, electrical power needs to be constantly supplied at reading of Data #1, reading of Data #2, and reading of Data #3. Reference sign 511 denotes a row decoder, and Reference sign 512 denotes a column decoder.

FIG. 6 is a diagram schematically illustrating a memory unit composed of a conventional STT-MRAM and operation and electric power consumption thereof. The upper part of FIG. 6 schematically illustrates a memory unit 610. The middle part of FIG. 6 illustrates regions at columns from which data is read when Data #1, Data #2, and Data #3 are sequentially read at each column. In the lower part of FIG. 6, the horizontal axis represents time, the vertical axis represents electric power consumption, and the depth axis represents the position of a memory grain.

In a conventional STT-MRAM disclosed in Non Patent Literature 9, a fine-grain power gating technology is employed so that a power driver 618 is provided for each reference data of one Data, in other words, for each set of N memory grains 619, and independently supplied with electric power. Thus, electrical power can be supplied in accordance with the location of access reference data specified by the addresses of a column decoder and a row decoder at writing of reference data, reading of Data #1, reading of Data #2, and reading of Data #3, and no electrical power needs to be supplied to an unnecessary memory place. However, power gating is provided for each Data, and thus all memory grains 619 are simultaneously supplied with electrical power to read data of all dimensions in one Data. Reference sign 611 denotes a row decoder, and Reference sign 612 denotes a column decoder.

Next, the similarity evaluation unit 130 will be supplementarily described. The similarity evaluating unit 130 includes the current-mode similarity evaluation cells 133 for each column, and includes, for each column, the switch 134 connecting the similarity evaluation cells 133 adjacent to each other, and thus the current-mode similarity evaluation cells 133 can be reconstructed by turning on and off the first switch 134a. Each switch 134 is turned on and off in a flexible manner in accordance with the dimension number of reference data and search data, thereby providing an extremely compact circuit for searching for reference data similar to the search data. Moreover, a highly dense and adaptive associative memory is provided.

Figure 7A:
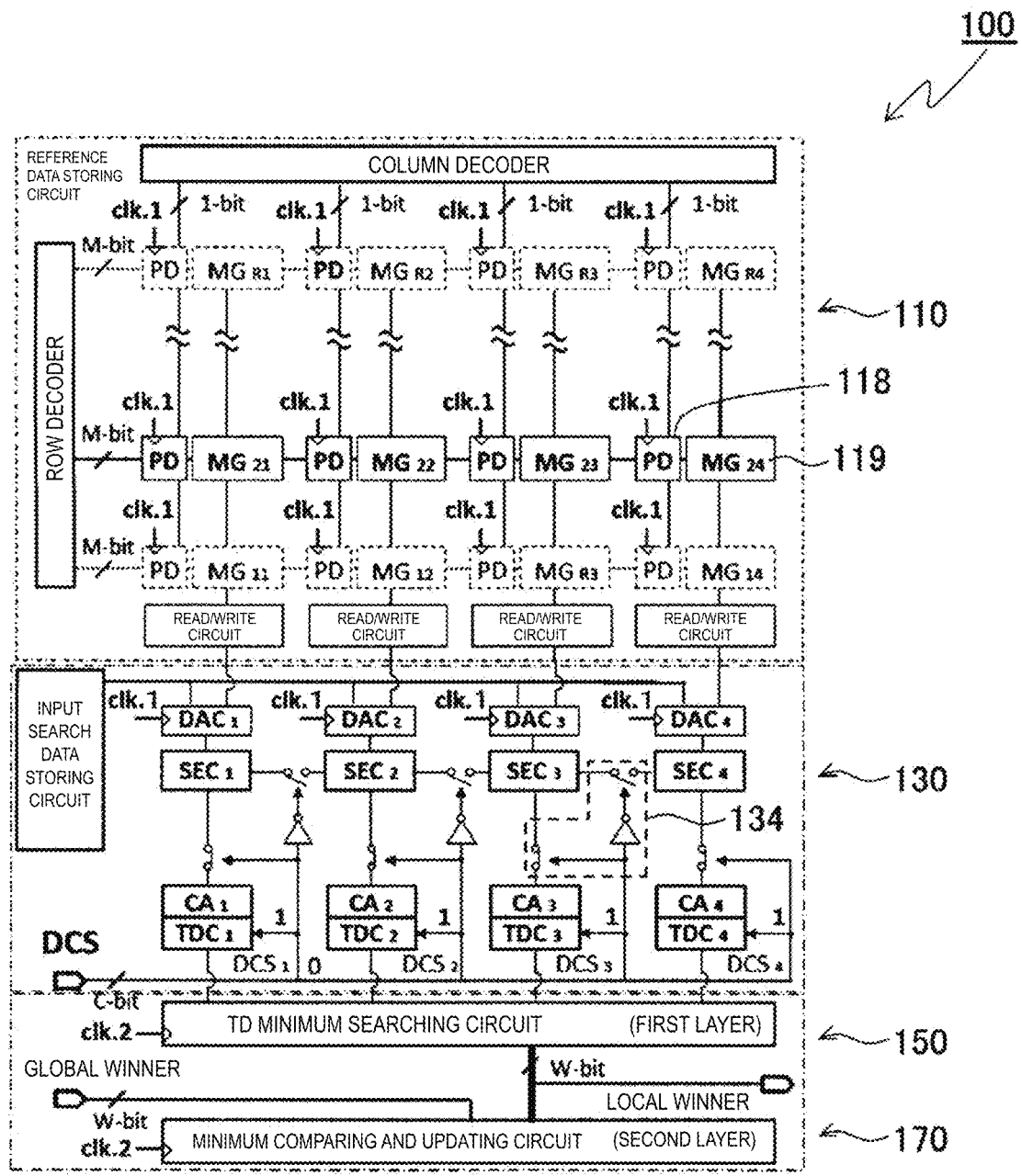
FIG. 7A is a diagram illustrating reconstruction of the memory device when reference data is one-dimensional.
Figure 7B:
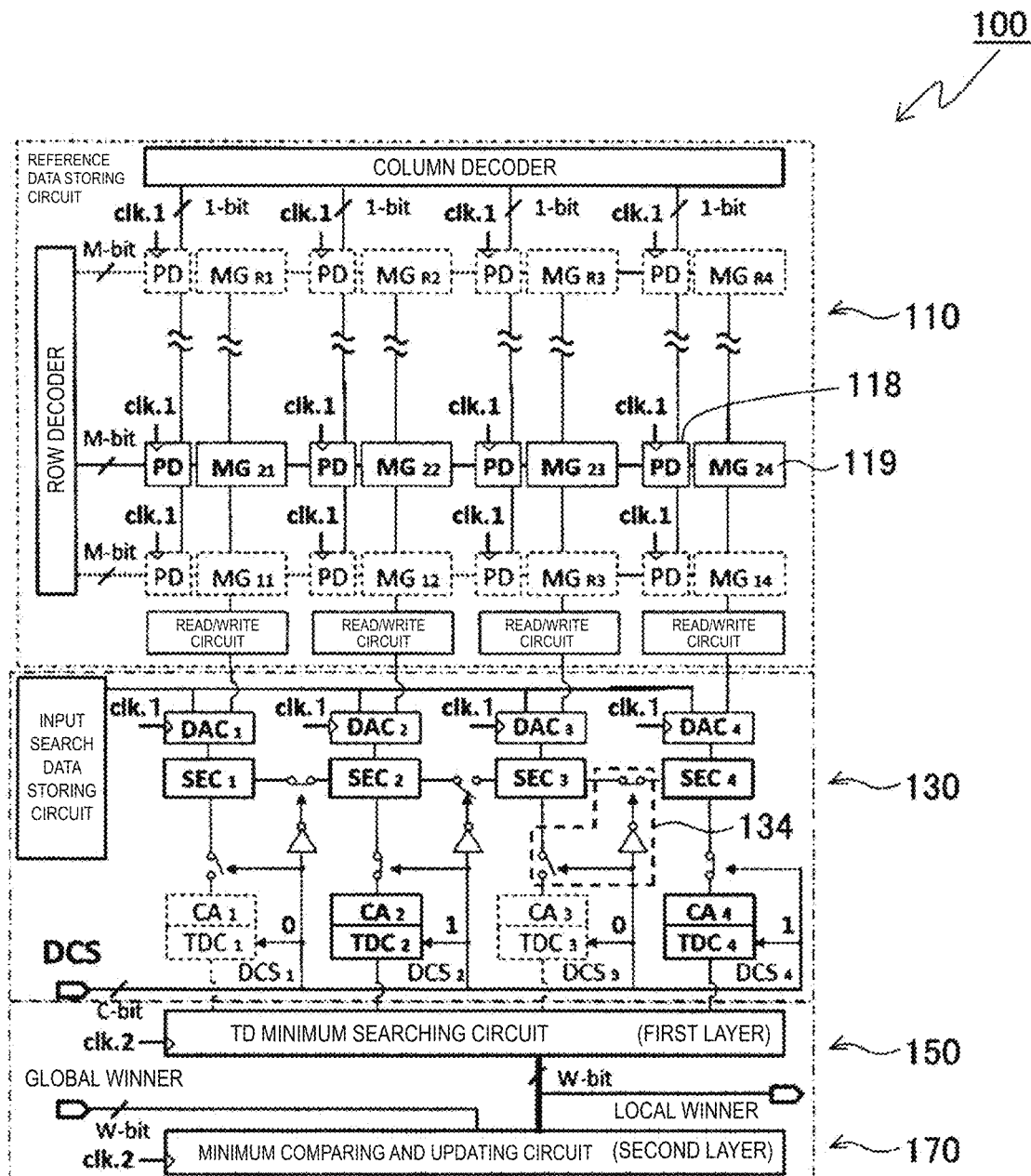
FIG. 7B is a diagram illustrating reconstruction of the memory device when reference data is two-dimensional.
Figure 7C:
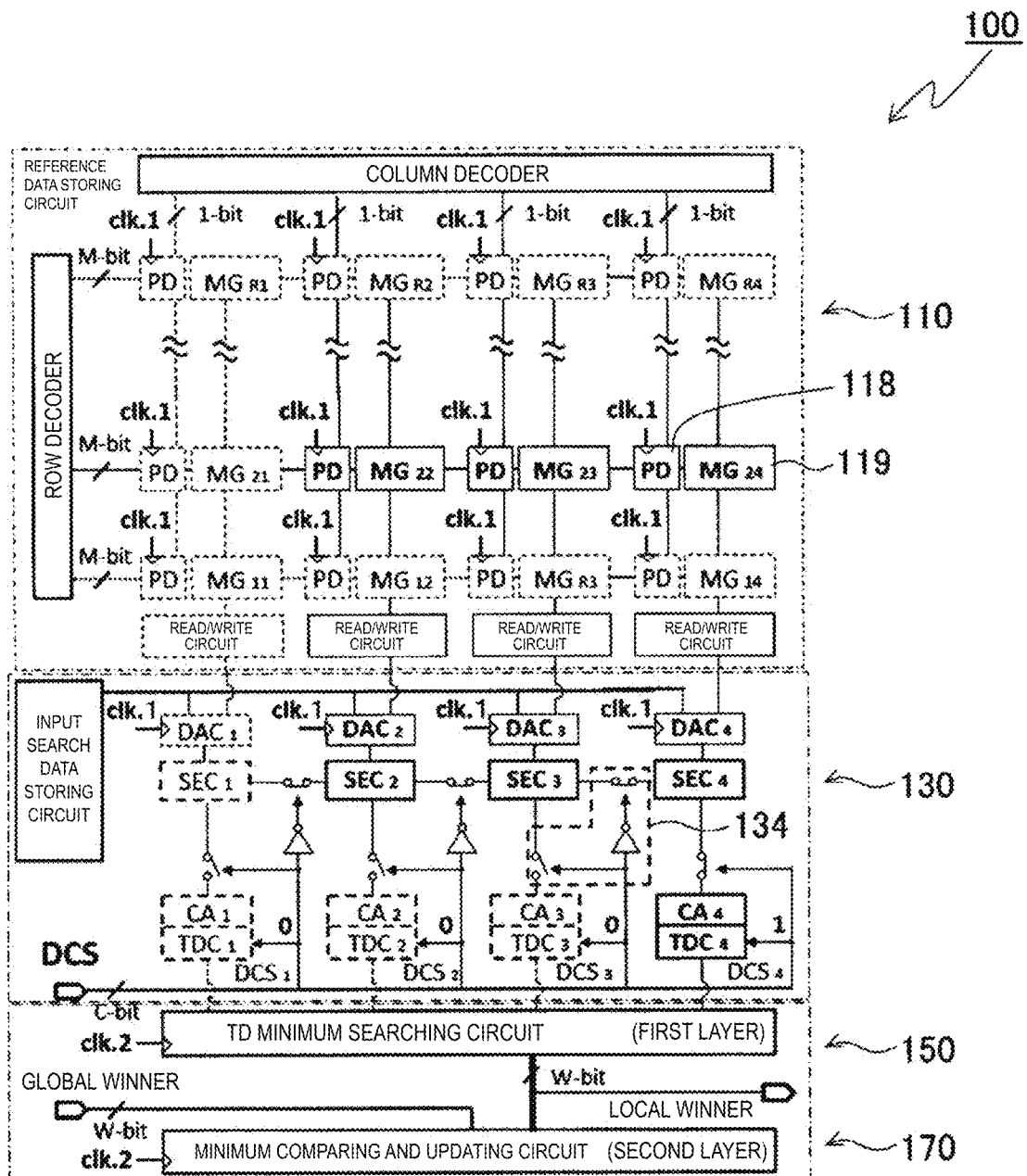
FIG. 7C is a diagram illustrating reconstruction of the memory device when reference data is three-dimensional.
Figure 7D:
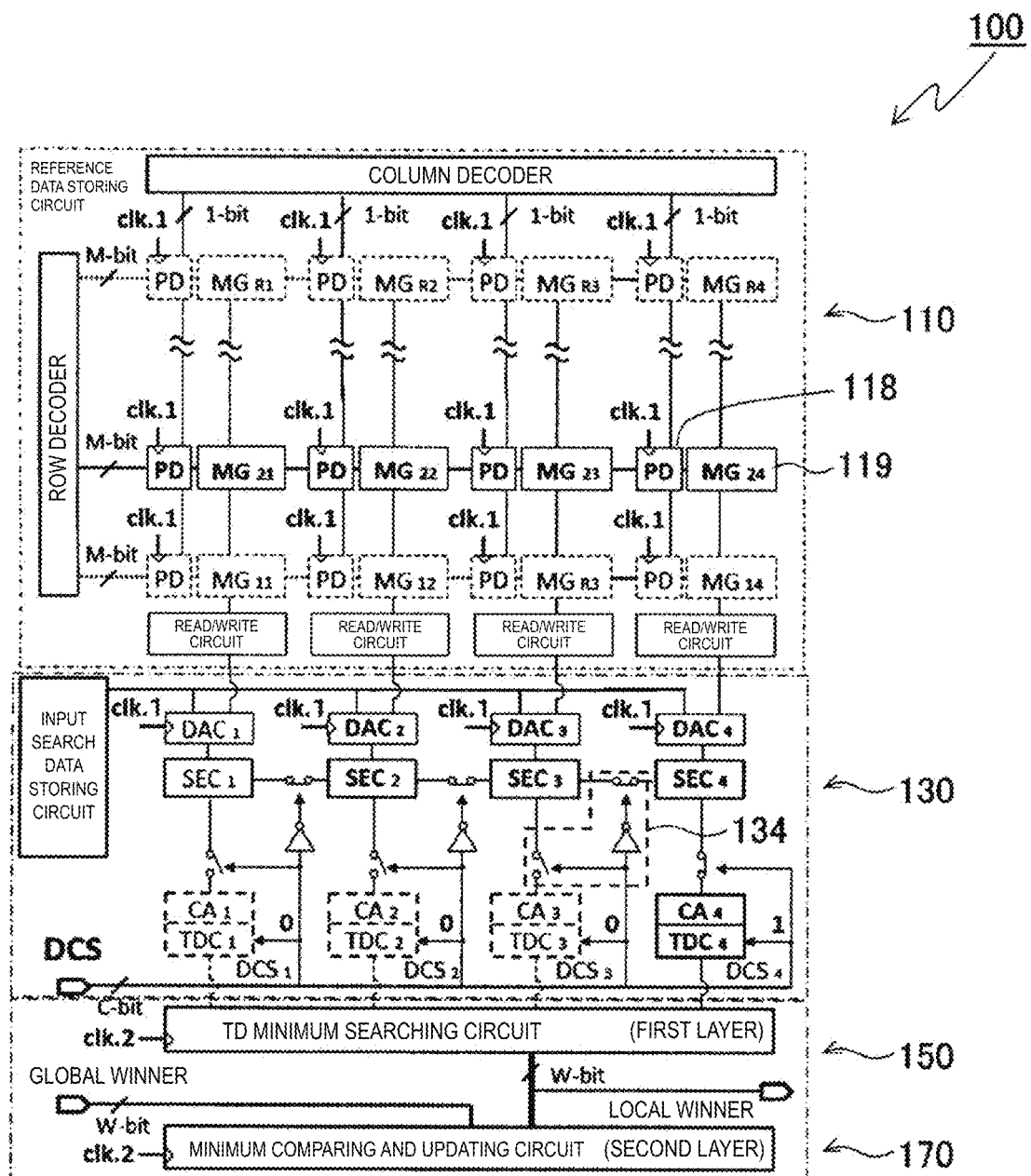
FIG. 7D is a diagram illustrating reconstruction of the memory device when reference data is four-dimensional.

The following describes a system architecture (the case of the column number C=4) reconstructed in accordance with one to four-dimensional reference data as a chip including an R×4 matrix of memory grains. FIG. 7A is a diagram illustrating reconstruction of the memory device when reference data is one-dimensional. FIG. 7B is a diagram illustrating reconstruction of the memory device when reference data is two-dimensional. FIG. 7C is a diagram illustrating reconstruction of the memory device when reference data is three-dimensional. FIG. 7D is a diagram illustrating reconstruction of the memory device when reference data is four-dimensional. These diagrams illustrate operation states of cycle-based fine-grain controllable power gating of the nonvolatile memory device, and illustrate, with dotted lines, any memory grain 119 supplied with no electrical power in the memory unit 110. Similarly, in the similarity evaluating unit 130, any deactivated part is illustrated with dotted lines, and any non-deactivated part is illustrated with solid lines.

Figure 8:
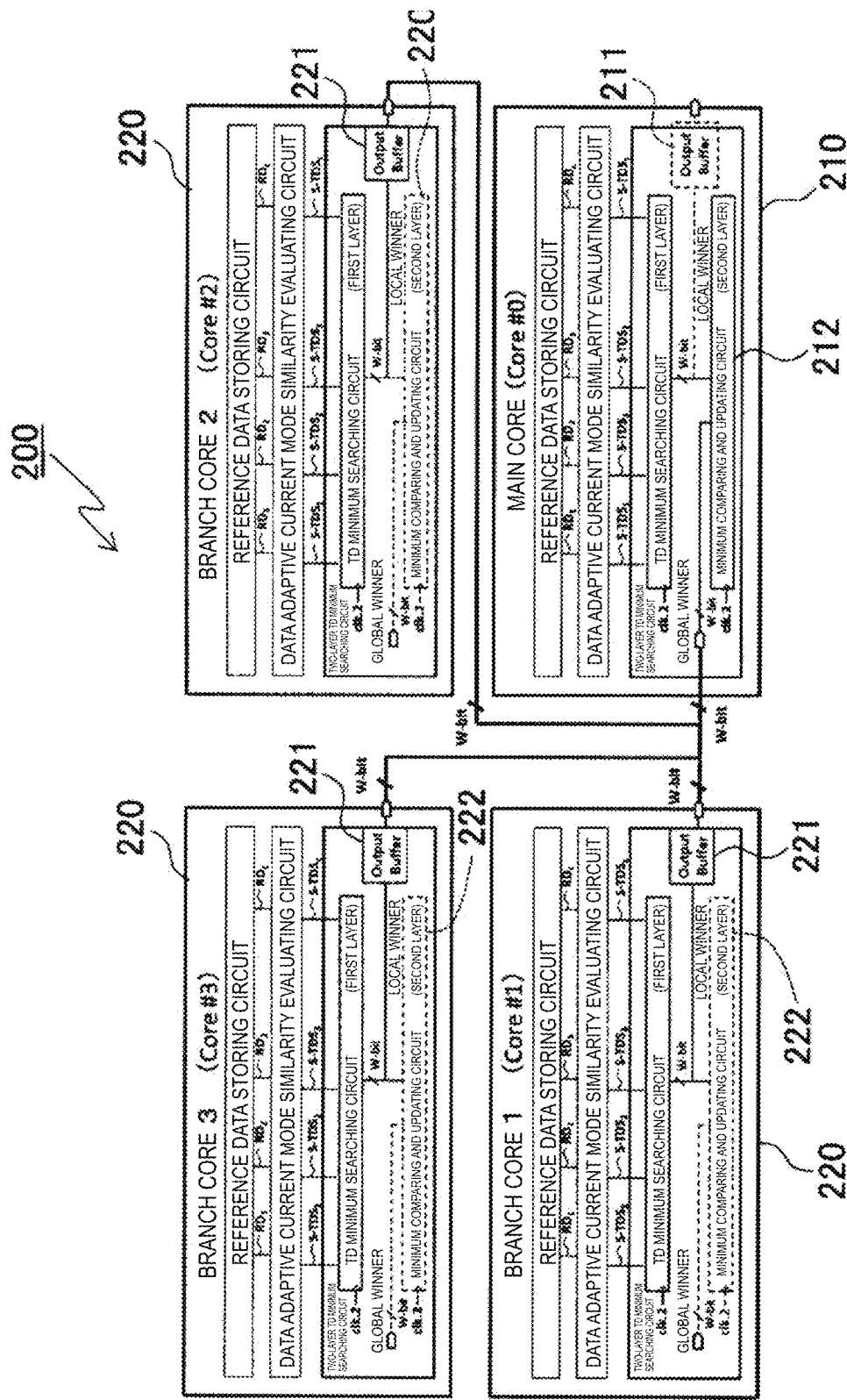
FIG. 8 is a configuration diagram of a memory system including a plurality of the memory devices illustrated in FIG. 3, one of which is a main core and the others of which are branch cores.

FIG. 8 is a configuration diagram of a memory system 200 including a plurality of the memory devices 100 illustrated in FIG. 3, one of which is the main core 210 and any other of which is the branch core 220. The main core 210 and each branch core 220 have identical configurations. An output buffer 211 is deactivated in the main core 210, and a minimum comparing and updating circuit 222 is deactivated in the branch core 220. In FIG. 8, each deactivated element is illustrated with dotted lines.

A minimum comparing and updating circuit 212 is activated only in the main core 210, and at each clock (clock 1), a result of the local winner (W bits) of each branch core 220 input to the minimum comparing and updating circuit 212 through a pipeline is compared with a self association result at the previous step, and the smaller result is updated by rewriting. Accordingly, reference data most similar to search data is detected from the entire multicore system. The number of connectable chips of the multicore system is determined by W of the local winner and the bit number M of one-dimensional data.

Figure 9:
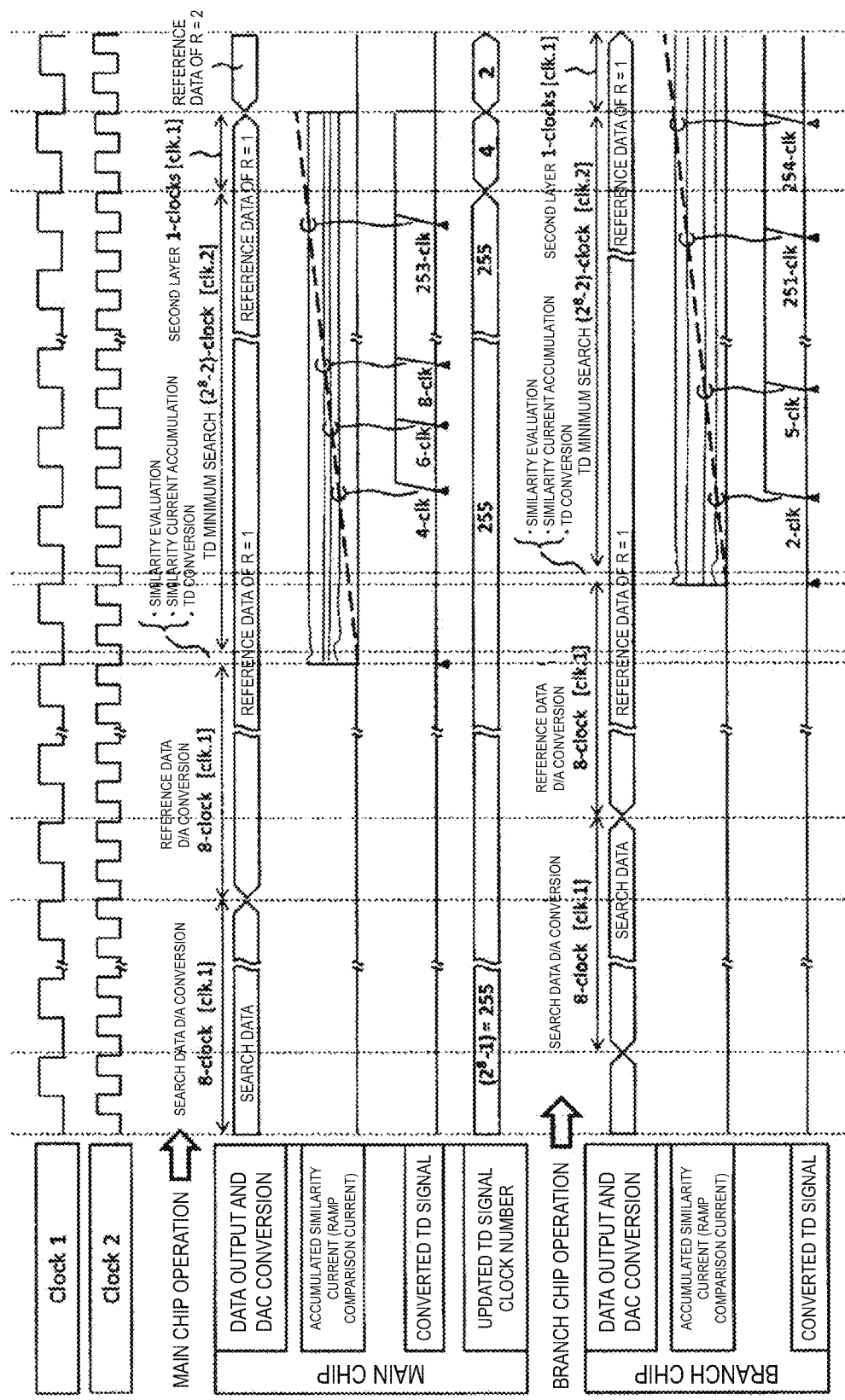
FIG. 9 is a time chart of claimed parts of a similarity evaluating unit, a searching unit, and a comparing and updating unit in the memory system illustrated in FIG. 8.

FIG. 9 is a time chart of claimed parts of a similarity evaluating unit, a searching unit, and a comparing and updating unit in the memory system illustrated in FIG. 8. FIG. 9 assumes a case with C=4, N=1, W=8, R=no restriction, illustrates exemplary operation at the main core 210 and each branch core 220, mainly illustrating system operation of current-mode similarity evaluation and two-level pipeline TD minimum searching.

Figure 10:
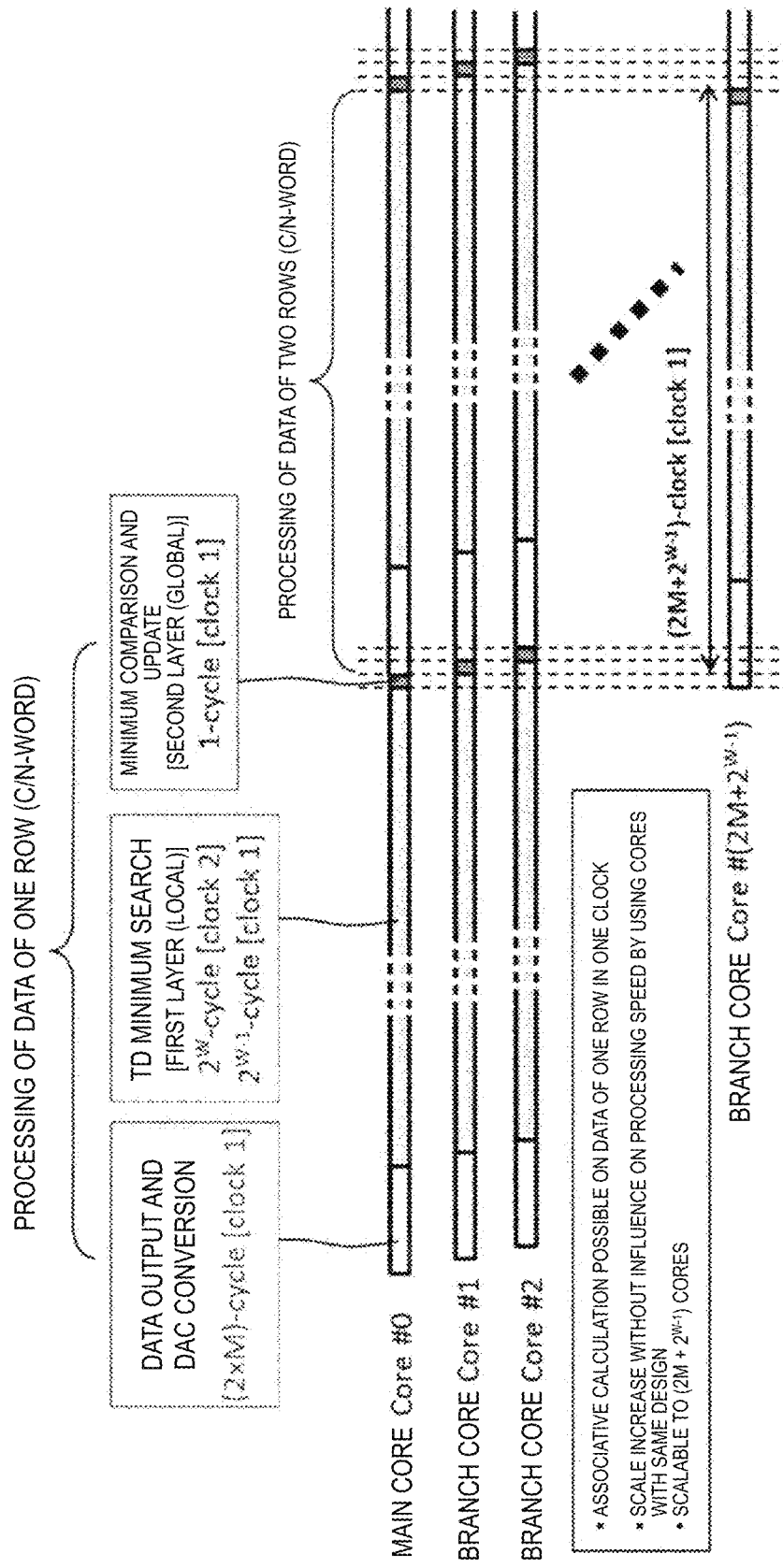
FIG. 10 is a diagram for description of operation of the memory system illustrated in FIG. 8.

FIG. 10 is a diagram for description of operation of the memory system 200 illustrated in FIG. 8. Each (one Data) of reference data and search data are composed of data of N ($\geq 1$) dimensions, and data of each dimension is expressed in an M-bit digital value. The reference data storing circuit as the memory unit 110 is composed of a memory cell array of (R×M) rows and C columns, one-dimensional data of R×C (C≥N) is stored in the memory grains 119, and an M-bit value is stored in each memory grain 119. The main core 210 takes $(2M+2^{W-1})$-clock to process "Data output and DAC conversion" and "TD minimum searching" on the second row, and during this time, "minimum comparing and updating" processing of the local winner from each branch core 220 is simultaneously executed, and thus $(2M+2^{W-1})$ cores can be connected to an identical system. Thus, a 144-core system is achieved when the memory bit number M of one-dimensional data is eight and the counter bit number W is eight as illustrated in FIG. 9.

As illustrated in FIG. 10, time domain minimum searching takes a longest time, and data D/A conversion and similarity evaluation take shorter processing times.

In the embodiment of the present invention, digital analog conversion is performed for each row of the memory area, which causes delay. Although the digital analog conversion processing causes delay, the time domain minimum searching takes the longer processing time and is dominant. In an NNS associative memory in the conventional analog approach, a plurality of dimensions of reference data are converted through one D/A conversion. In the embodiment of the present invention, one piece of one-dimensional data is converted by one digital analog convertor, which eliminates conversion overhead to achieve faster processing. In an NNS associative memory in any of the analog approach and the digital approach, and in the embodiment of the present invention, the processing time of searching for a minimum value (that is, an earliest time-domain signal) from a time-domain signal is more dominant than D/A conversion. For example, the D/A conversion needs a time of 8-cycle, and the time domain minimum searching needs a time of 100 to 200-cycle. This is because a ramp signal needs to be long enough to achieve a resolution for distinguishing an early time-domain signal and a late time-domain signal. Similarity currents having a small difference therebetween cannot be distinguished from each other when a time from 0 V to, for example, 1 V is insufficiently long. Specifically, since a similarity, which is a digital value in a case of an associative memory in the digital approach, or a current value in cases of an associative memory in the analog approach and the embodiment of the present invention, is converted into delay of a time-domain signal, the difference between time-domain signal delays converted from similarities having a small difference therebetween is small, and thus the distinction is difficult without measurement in a sufficiently long time.

In the embodiment of the present invention, multicore-based pipeline operation is employed to improve a time-domain minimum searching speed. The pipeline absorbs a time taken for local long time-domain minimum searching processing at each core so that the processing is completed in one clock. When this multicore-based pipeline scheme is not used, information on similar reference data is obtained at a speed equivalent to that for an associative memory in the conventional analog approach.

Figure 11:
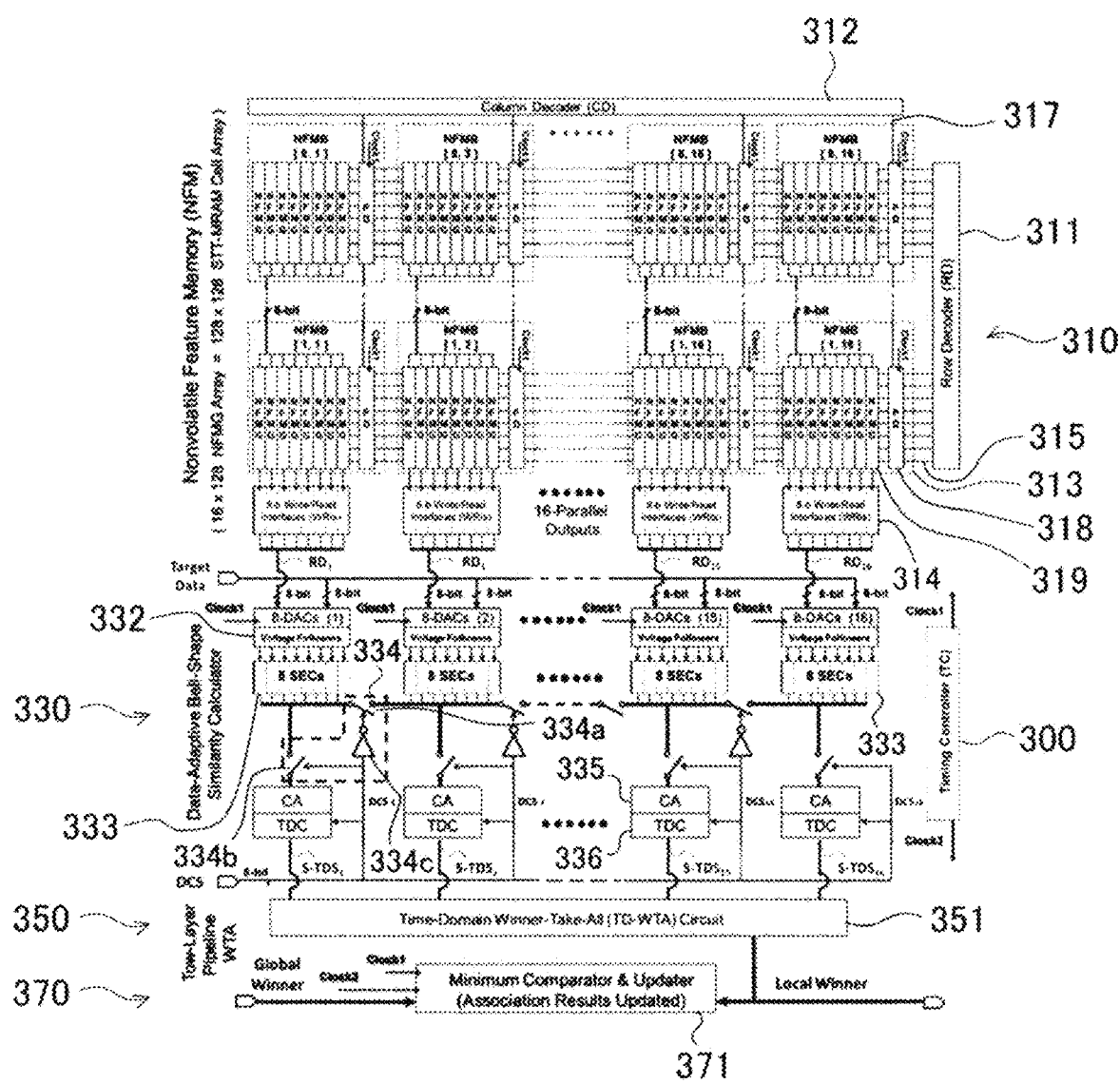
FIG. 11 is a block configuration diagram according to an implementation example.

The following describes the implementation example. FIG. 11 is a block configuration diagram according to the implementation example. A low electrical power, highly dense, and adaptive nonvolatile associative memory device is assumed for application to image recognition. This memory device 310 illustrated in FIG. 11 includes a memory unit 310, a similarity evaluating unit 330, a searching unit 350, and a comparing and updating unit 370 similarly to the configuration in FIG. 3, and further includes a timing controller 390. The memory device 310 is a prototype chip assuming eight-dimensional, 16-dimensional, 32-dimensional, 64-dimensional, and 128-dimensional image feature data. The memory device 310 is basically applicable to any data, the dimension number of which is an integral multiple of eight. Parameters described with reference to FIG. 3 are as follows.

N=8 dimensions, 16 dimensions, 32 dimensions, 64 dimensions, and 128 dimensions: Application is possible to any dimension of an integral multiple of eight.

M=8 bits

C=128 columns

R=16 rows

W=8 bits (the bit number of the counter of the minimum comparing and updating circuit)

For application to an integral multiple of eight, the PDs and similarity current accumulation switches of memory grains are each designed for every eight dimensions.

With this configuration, when a switch 334 odd-numbered from the left is operated to close a first switch 334a by an external dimension control signal, the system is applicable to 16-dimensional data. Evaluation of performance such as the speed of a measured waveform to be described later or the like is a result in 16-dimensional texture recognition.

The following describes a specific embodiment of the memory device 100 illustrated in FIG. 3 by describing the basic circuit configuration of each component in the implementation example.

Figure 12:
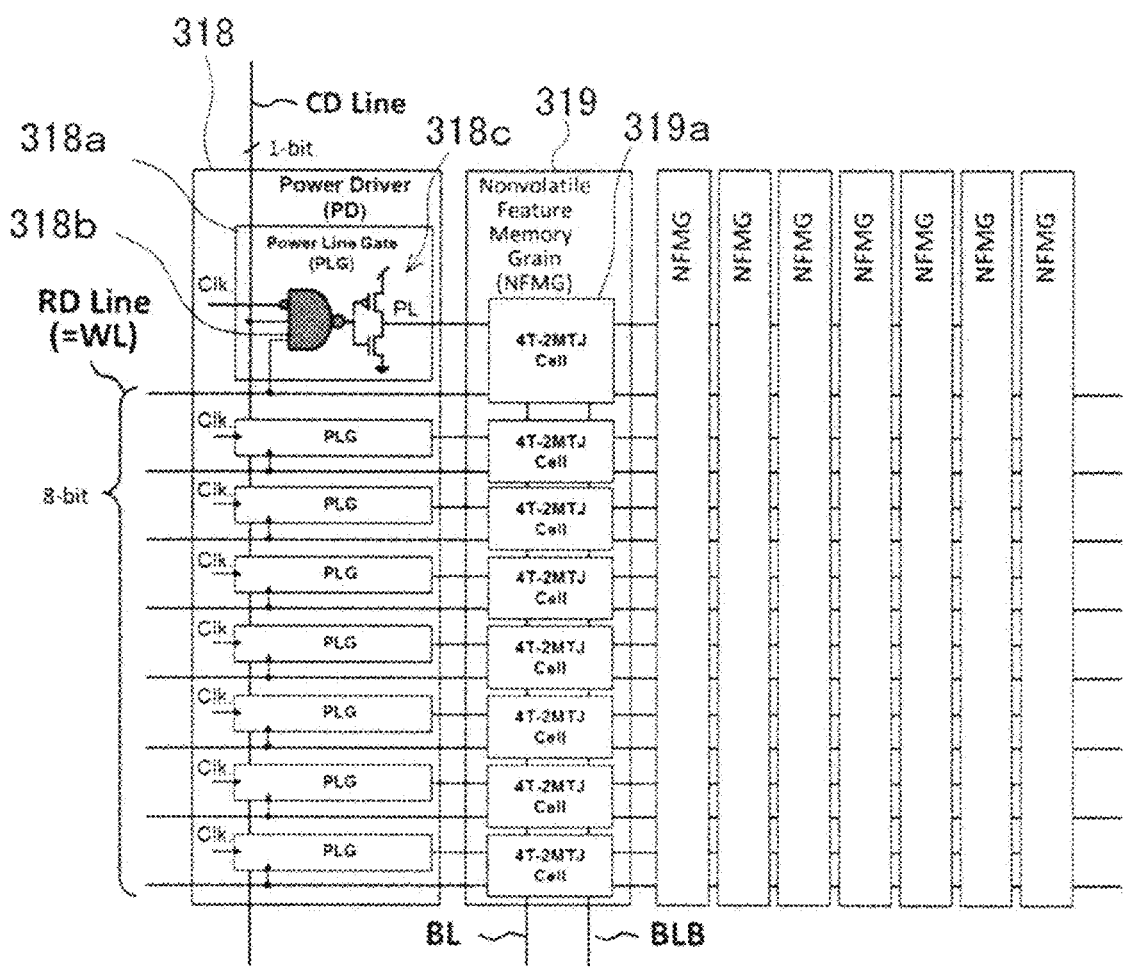
FIG. 12 is a block diagram of each region of a memory area in the implementation example.

FIG. 12 is a block diagram of each region of the memory area in the implementation example. FIG. 12 illustrates a region of the memory area described with reference to FIG. 3. This region includes a pair of one power driver 318 and K (=8) nonvolatile memory grains 319, and the power driver 318 includes M power line gates 318a. One line among a column line (CD line), a clock signal input line, and a row line (RD line) is input to a logical calculator 318b of each power line gate 318a, and a clock signal is inverted and input to the logical calculation circuit 318b. An output signal from the logical calculator 318b is input to an inverter circuit 318c connected with a power source line. An output from the inverter circuit 318c is input to a 4T-2MTJ cell 319a as a power line PL. Reference signs BL and BLB denote a pair of bit lines.

Figure 13A:
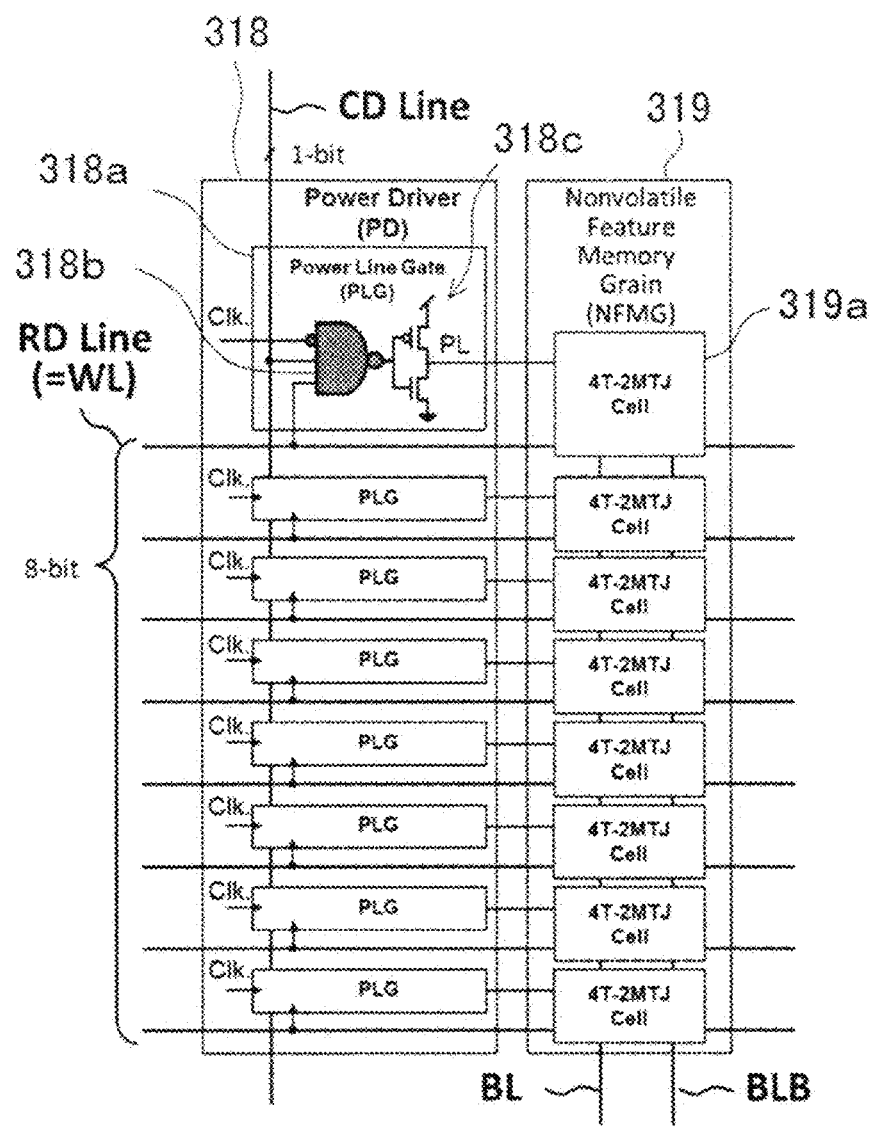
FIG. 13A is a block diagram of the memory area in the implementation example illustrated in FIG. 12 when it is assumed that one nonvolatile memory grain is provided and a power driver is provided for each dimension of the reference data.
Figure 13B:
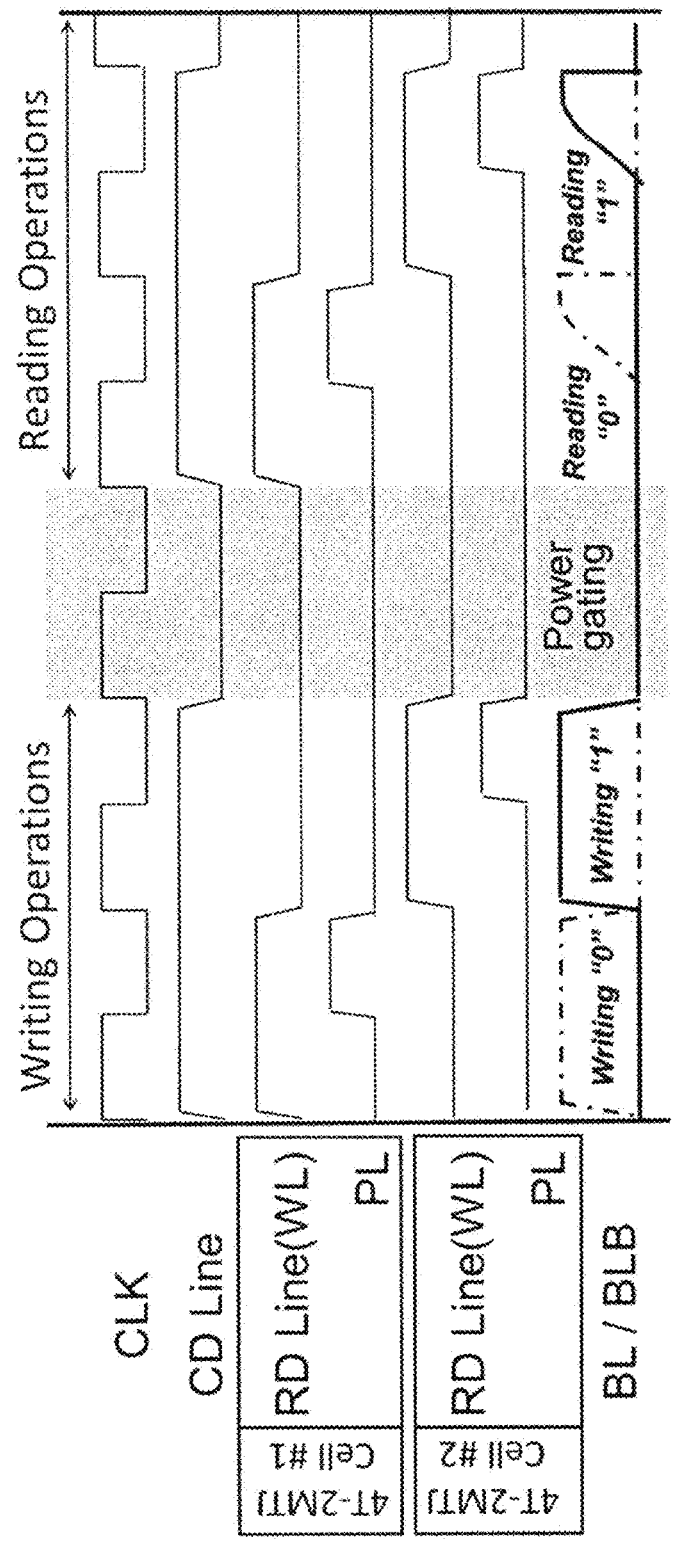
FIG. 13B is a time chart illustrating operation of the unit illustrated in FIG. 13A.

FIG. 13A illustrates a case in which only one nonvolatile memory grain 319 is provided and the power driver 318 is provided for each dimension of reference data in the configuration of the block diagram illustrated in FIG. 12. FIG. 13B is a time chart illustrating operation of the unit illustrated in FIG. 13A in which data is continuously read from two 4T-2MTJ memory cells (Cell #1 and Cell #2). As described above, in reading operation, when the clock signal is "0", the CD line is "1", and the corresponding RD line is "1", the power line PL is "1", and reading processing is performed.

Figure 13C:
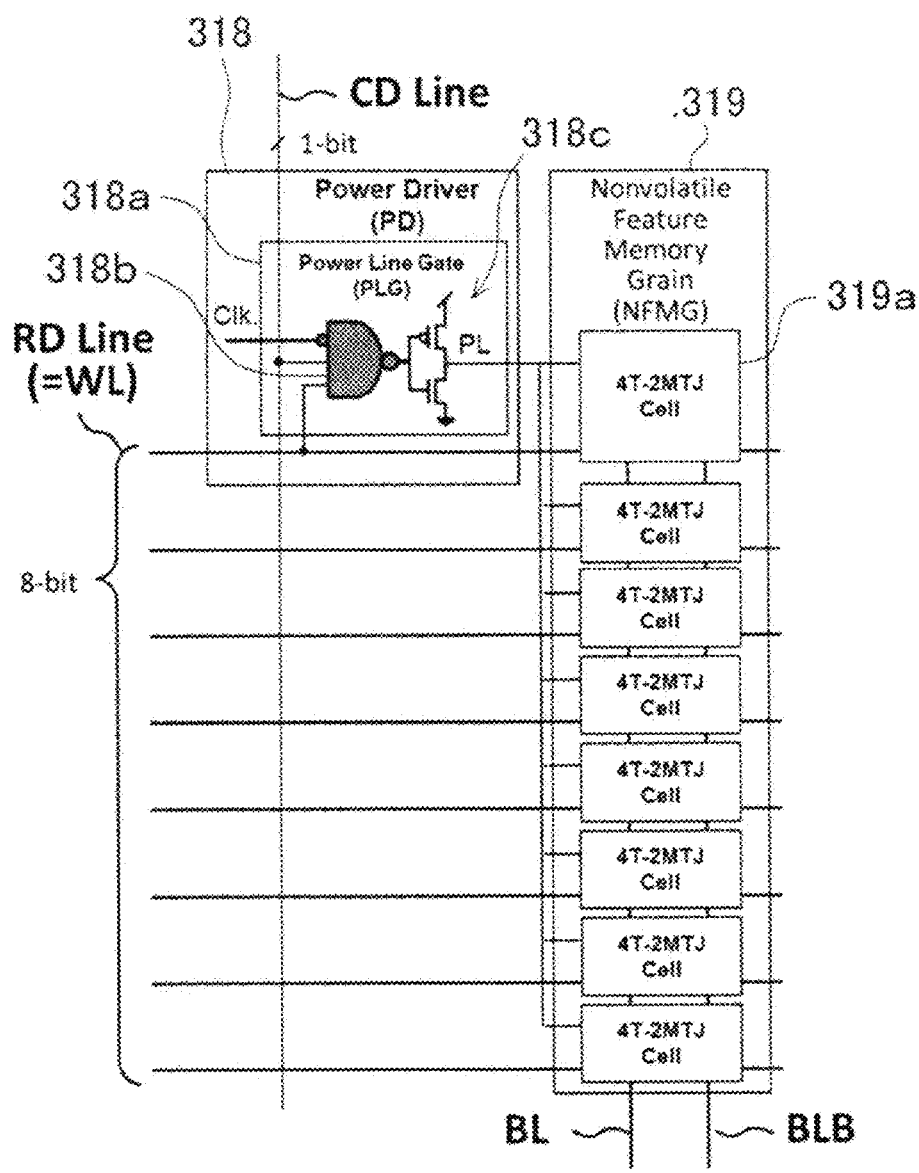
FIG. 13C is a diagram illustrating a modification of the circuit illustrated in FIG. 13A.

FIG. 13C illustrates a modification of the circuit illustrated in FIG. 13A. The power line PL may be output from one power line gate to M 4T-2MTJ cells 319a in parallel.

Figure 14:
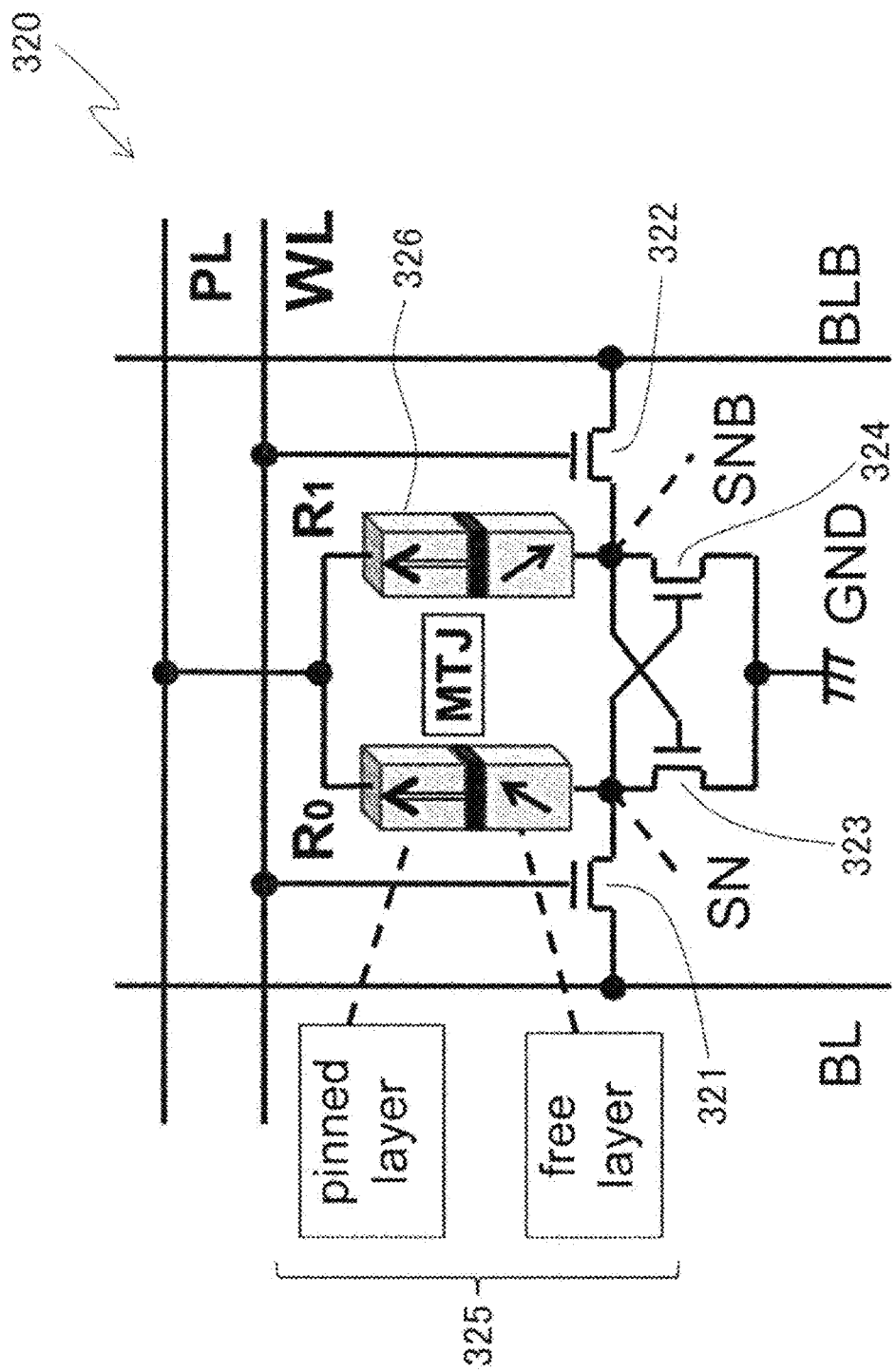
FIG. 14 is a circuit diagram of a 4T-2MTJ memory cell in the memory unit.
Figure 15:
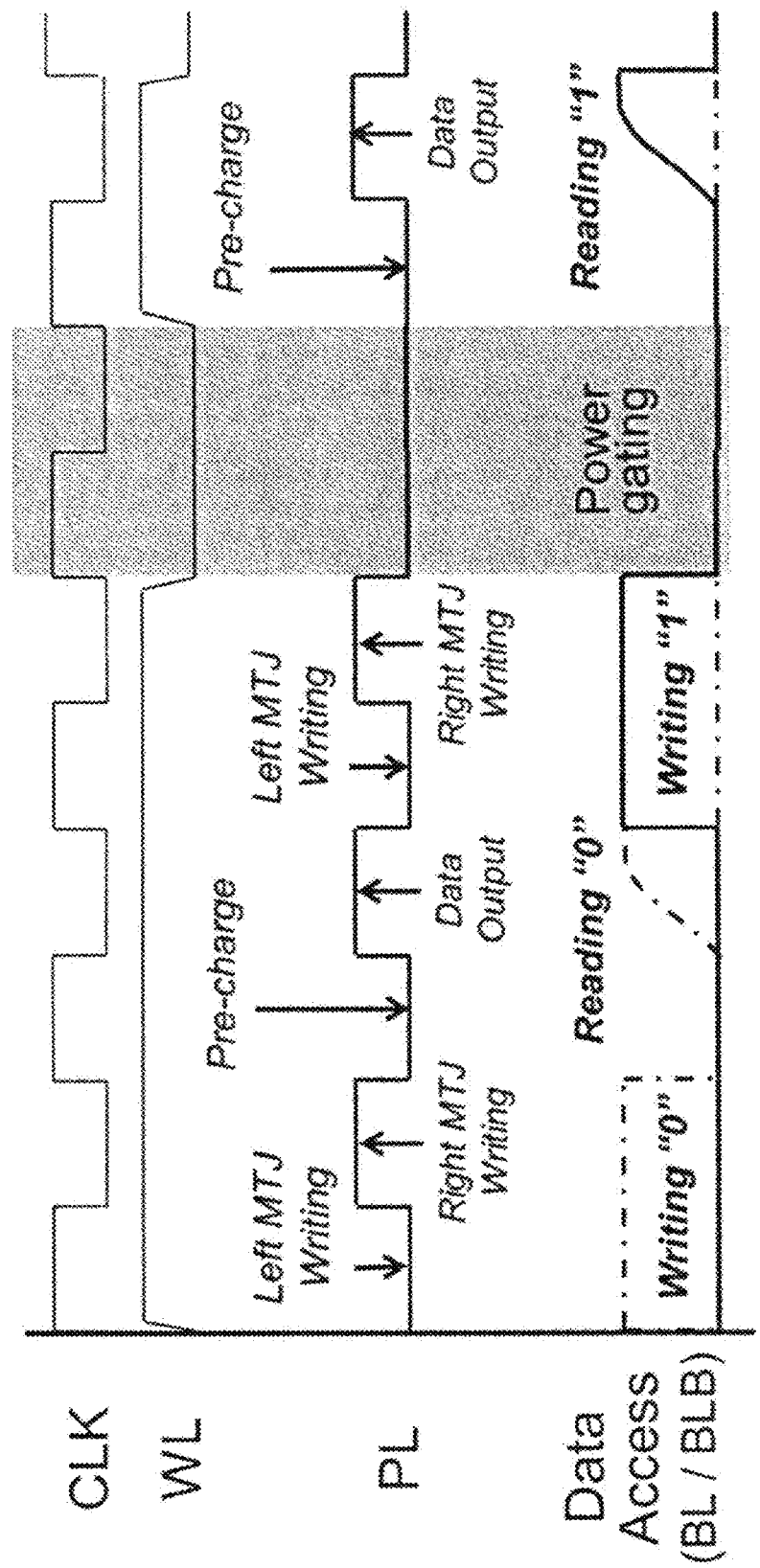
FIG. 15 is a time chart for description of operation of the 4T-2MTJ memory cell illustrated in FIG. 14.

FIG. 14 is a circuit diagram of a 4T-2MTJ memory cell 320 in the memory unit 310. The 4T-2MTJ memory cell 320 is a differential-pair STT-MRAM cell including four N-type MOSFETs 321 to 324 and two MTJs 325 and 326. The MTJs 325 and 326 are each composed of a pinned magnetic layer, an insulating layer, and a free magnetic layer. The pinned magnetic layers of the MTJs 325 and 326 are connected with the power line PL. The free magnetic layers of the MTJs 325 and 326 each record a state parallel or anti-parallel to the pinned magnetic layer, thereby storing a digital value. FIG. 15 is a time chart for description of operation of the 4T-2MTJ memory cell illustrated in FIG. 14.

When data is written to the 4T-2MTJ cell 320, the bit lines (BL and BLB) are connected with sense nodes (SN and SNB) by applying, for example, high voltage to a word line WL so that high voltage (1 V) and low voltage (0 V) are set to the bit lines BLB and BL. When data of "1"/"0" is written to the 4T-2MTJ cell 320, the power line PL is controlled by a clock signal so that the power line PL is set to 0 V in the first half of a clock to write the right and left MTJs 325 and 326 in an anti-parallel manner, and the power line PL is set to 1 V in the second half of the clock to write the left and right MTJs 325 and 326 in a parallel manner.

When data is read from the 4T-2MTJ cell 320, the bit lines (BL and BLB) are connected with the sense nodes (SN and SNB) by applying 1 V to the word line WL, and the power line PL is controlled by a clock signal so that the PL is set to 0 V in the first half of a clock to pre-charge each of the bit lines BLB and BL and the sense nodes SN and SNB to 0 V, and the power line PL is set to 1 V in the second half of the clock to read the voltage difference between the sense nodes SN and SNB through the bit lines BLB and BL.

Figure 16:
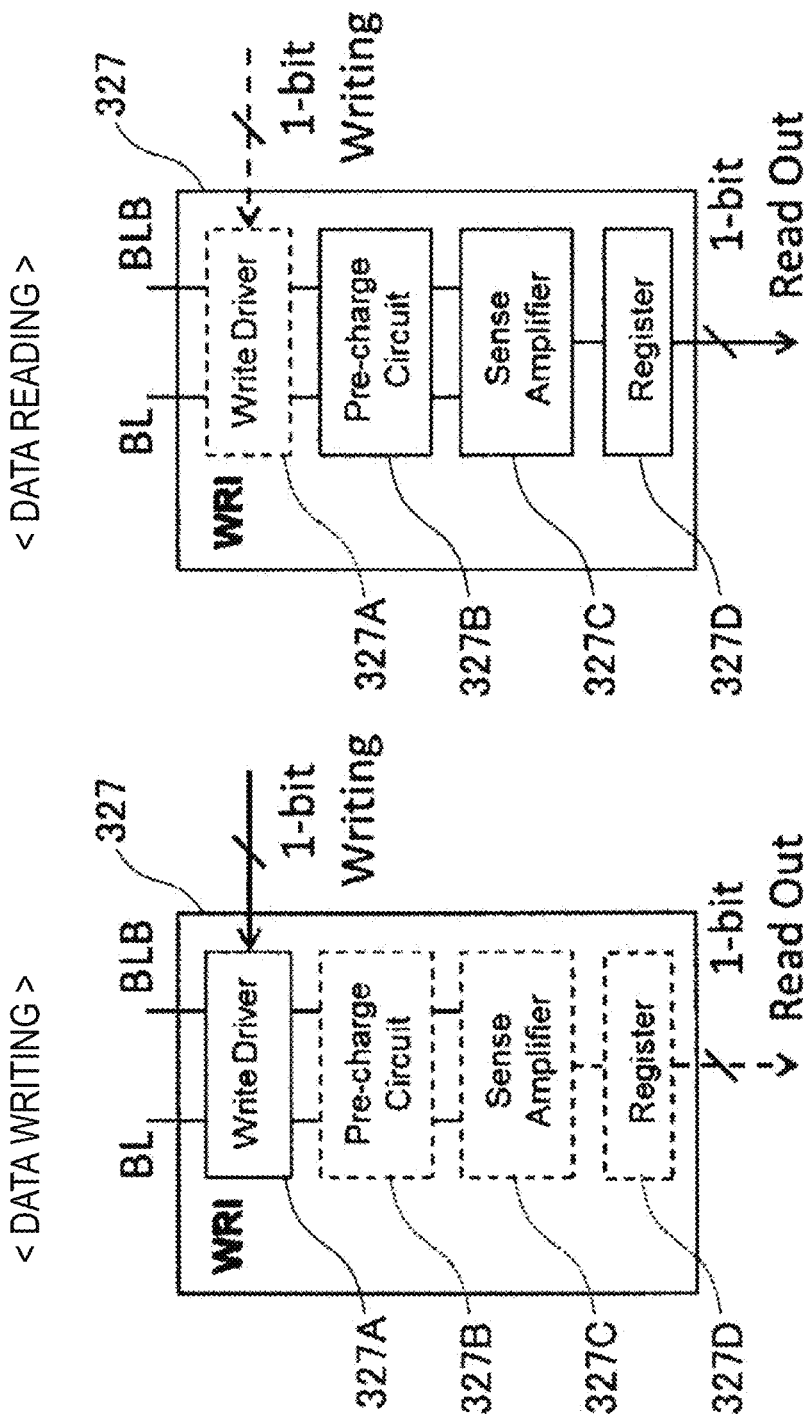
FIG. 16 is a block diagram of a read/write circuit in the implementation example illustrated in FIG. 12.

FIG. 16 is a block diagram of the read/write circuit 114 illustrated in FIG. 3. The read/write circuit 114 is composed of M read-write interface (WRI) circuits, and accesses the 4T-2MTJ cells 320 at M columns through the bit lines (BL and BLB) to read or write data of M bits in one clock. Each WRI circuit 327 includes a write driver circuit 327A, a pre-charge circuit 327B, a sense amplifier circuit 327C, and a digital register circuit 327D. The write driver circuit 327A is used to write data, and the pre-charge circuit 327B, the sense amplifier circuit 327C, and the digital register circuit 327D are used to read data, thereby processing data of one bit in one clock.

Figure 17:
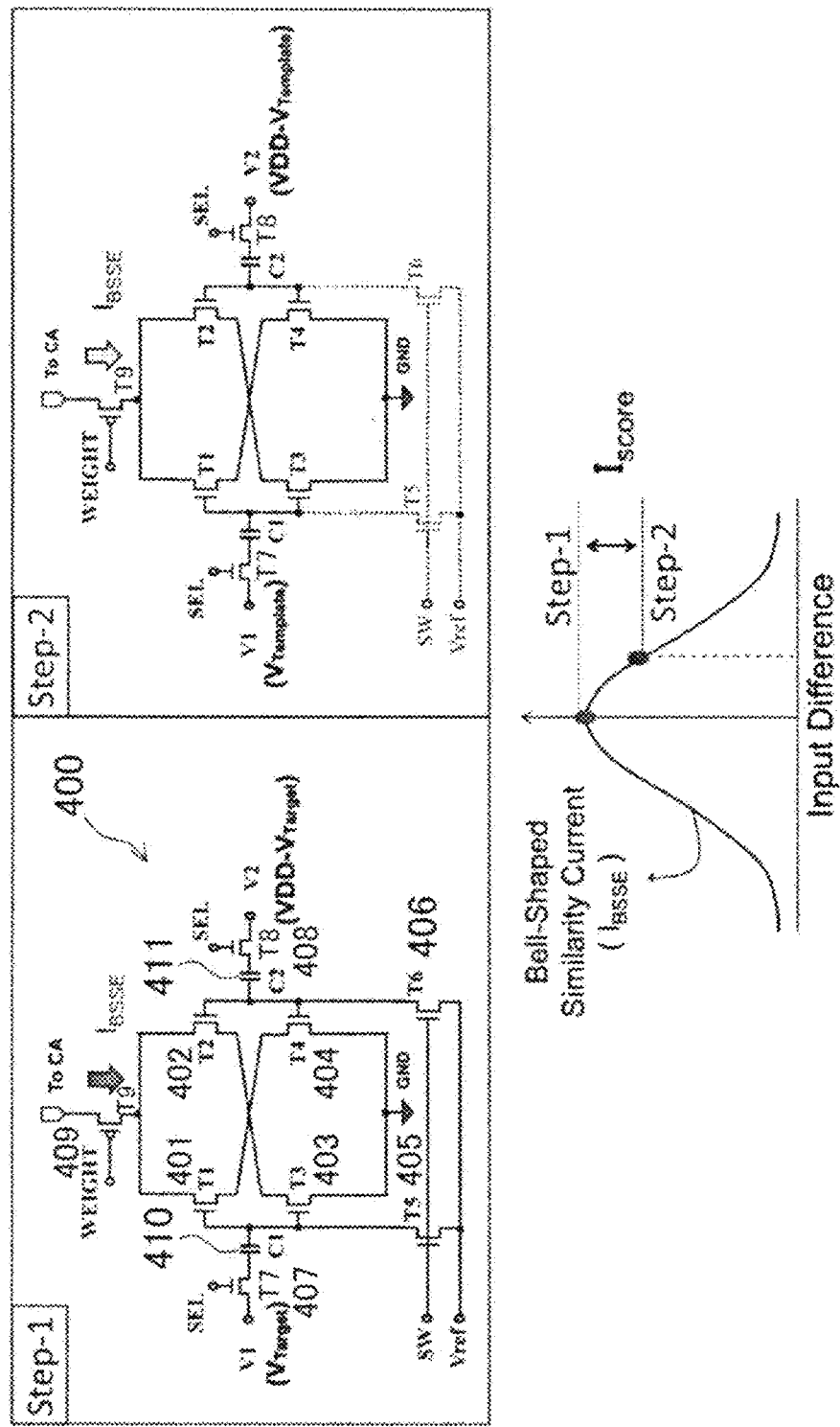
FIG. 17 is a circuit diagram of a similarity evaluation cell in the implementation example illustrated in FIG. 12.

FIG. 17 is a circuit diagram of the similarity evaluation cell 133 illustrated in FIG. 3. A similarity evaluation cell 400 includes nine N-type MOSFETs (T1 to T9) 401 to 409 and two capacitors (C1 and C2) 410 and 411. Analog voltage signals are input through ports V1 and V2 on both sides at two divided steps. Step 1 is illustrated on the left side in the upper part, and Step 2 is illustrated on the right side in the upper part. As illustrated in the lower part, the similarity evaluation cell 400 is a circuit configured to determine a voltage difference between Steps 1 and 2, and output the voltage difference to a current accumulator as similarity current (IBSSE) that satisfies a similarity evaluating function.

At Step 1, SW is set to "H", and target voltage as search data is applied to the input ports V1 and V2, thereby obtaining maximum similarity current. At Step 2, SW is set to "L" to hold gate electric charge of transistors T1, T2, T3, and T4, and template voltage as reference data is applied to the input ports, thereby obtaining similarity current that decreases in accordance with the difference between the template voltage and the target voltage.

Figure 18:
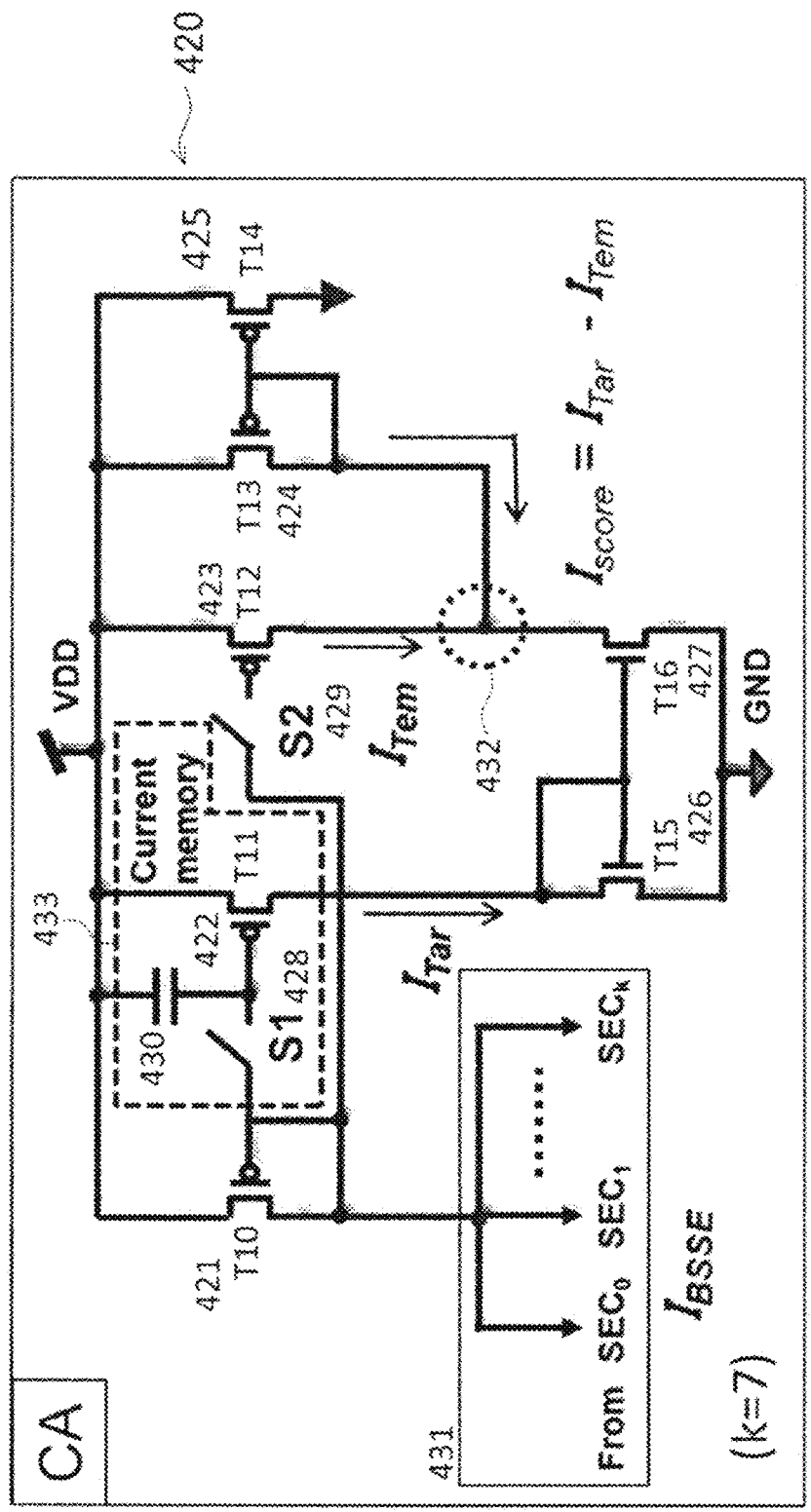
FIG. 18 is a circuit diagram of a current accumulating circuit in the implementation example illustrated in FIG. 12.

FIG. 18 is a circuit diagram of the current accumulator 135 illustrated in FIG. 3. A current accumulator 420 includes five P-type MOSFETs (T10 to T14) 421 to 425, two N-type MOSFETs (T15 to T16) 426 and 427, two switches (S1 and S2) 428 and 429, and one capacitor 430. The MOSFETs T10 and T11 form a current mirror, the MOSFETs T10 and T12 form a current mirror, the MOSFETs T13 and T14 form a current mirror, and the MOSFETs T15 and T16 form a current mirror. The circuit illustrated in FIG. 18 includes one current adder 431, one current subtractor 432, and one current memory 433. The circuit adds similarity currents (IBSSE) output from each of K similarity evaluation cells at two divided steps, and outputs the difference between the currents. These K values can be flexibly designed and adjusted by controlling the number of circuits of similarity evaluation cells connected with the current accumulator 420.

The current accumulator 420 first adds the similarity currents output from the K similarity evaluation cells (SEC) and corresponding to the search data at Step 1, sets the switch S1 (S2) to be on (off), and temporarily stores an obtained current result in the current memory 433 by using the current mirror formed by the MOSFETs T10 and T11. Then, the current accumulator 420 adds the similarity currents ($I_{Tem}$) output from the K similarity evaluation cells (SEC) and corresponding to the reference data at Step 2, sets the switch S1 (S2) to be off (on), copies an obtained current result $I_{Tem}$ by using the current mirror formed by the MOSFETs T10 and T12, calculates the difference between the current result $I_{Tem}$ and the stored current result $I_{Tar}$, and outputs the difference as a final similarity current ($I_{SCORE}$) of the search data and the reference data to a time-domain convertor (TDC).

Figure 19:
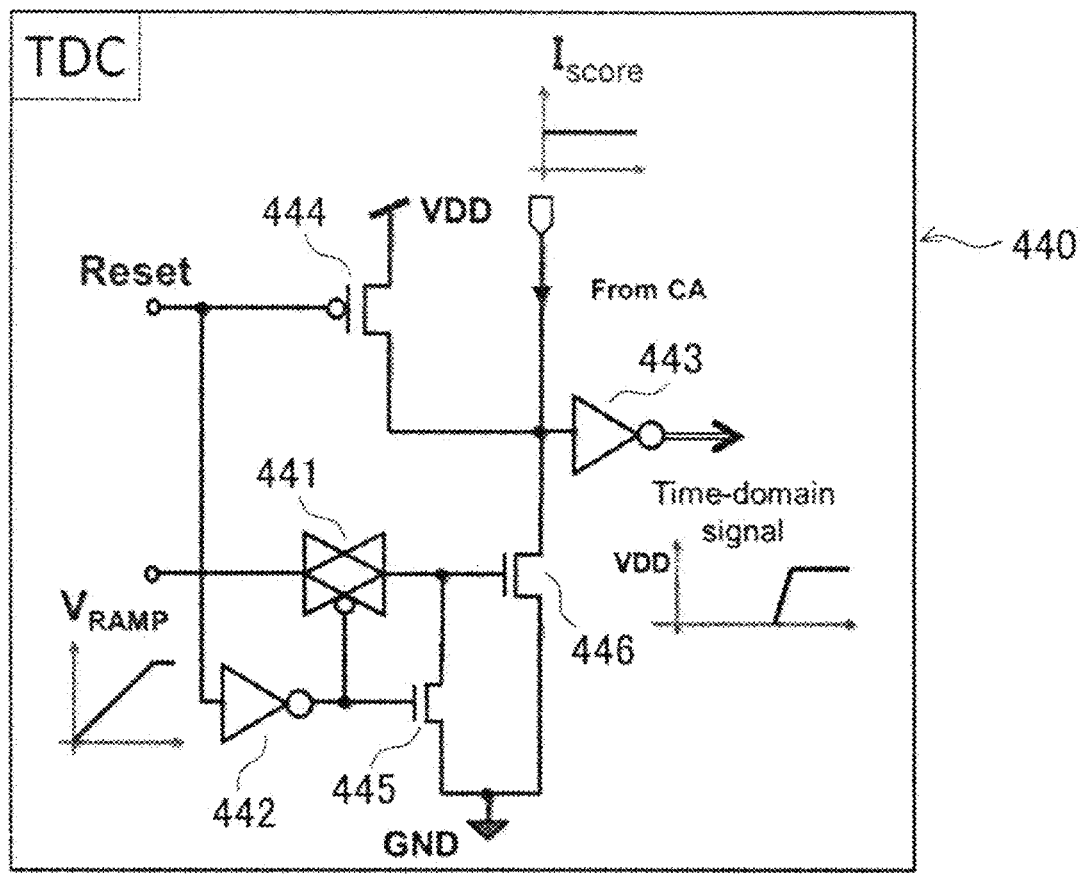
FIG. 19 is a circuit diagram of a time-domain convertor in the implementation example illustrated in FIG. 12.

FIG. 19 is a circuit diagram of the time-domain convertor 151 illustrated in FIG. 3. A time-domain convertor 440 includes one CMOS switch 441, two inverters 442 and 443, one P-type MOSFET 444, and two N-type MOSFETs 445 and 446, and converts the similarity current ($I_{SCORE}$) output from the current accumulator (CA) into a time-domain voltage delay signal.

The time-domain convertor 440 first initializes an output to GND by using a reset signal. Thereafter, the time-domain convertor 440 receives the voltage of a ramp signal simultaneously with inputting of the similarity current $I_{SCORE}$, and when the voltage of a switching node decreases beyond a threshold of an output inverter, the output of the time-domain convertor 440 rises to generate a TD voltage delay signal having a delay corresponding to the similarity current $I_{SCORE}$.

Figure 20:
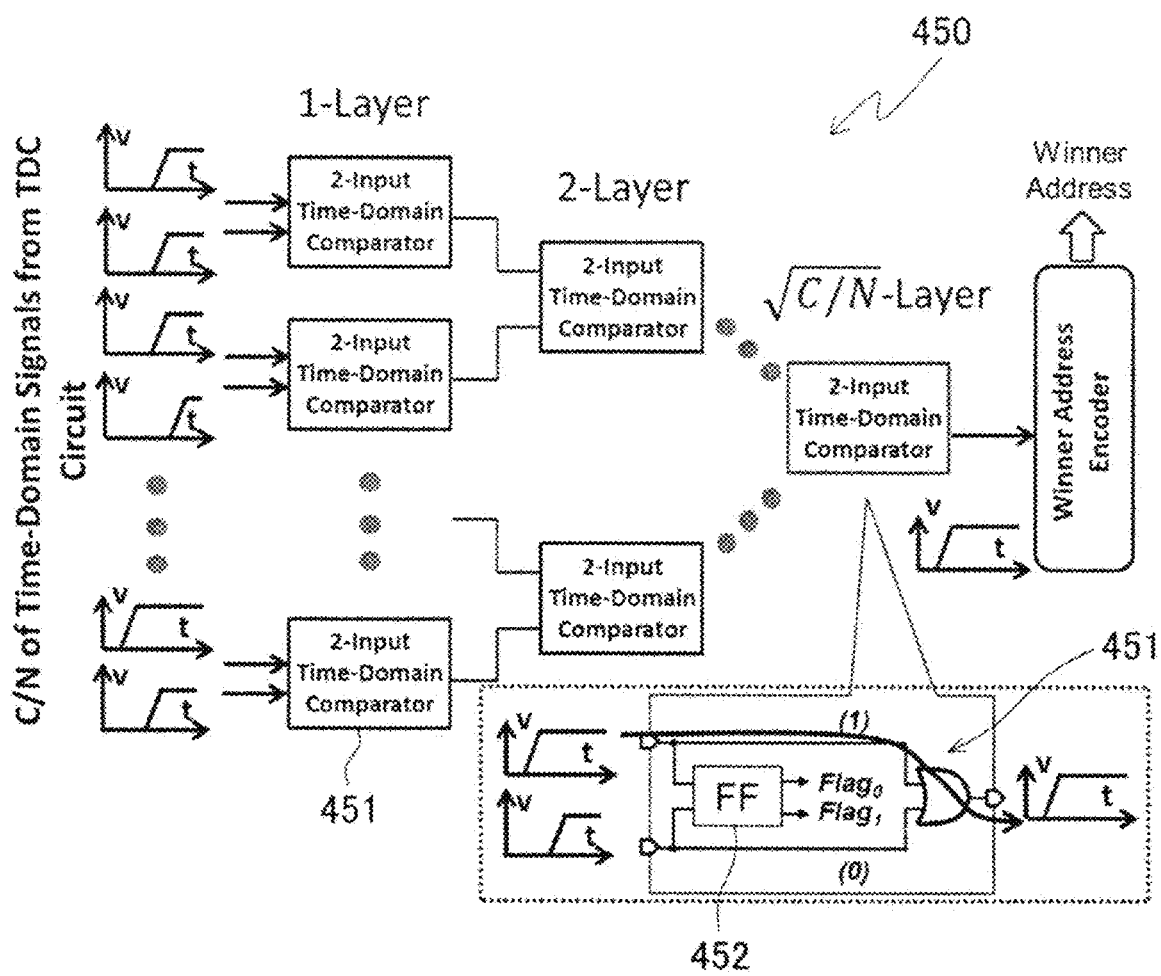
FIG. 20 is a block diagram of a TD-WTA circuit in a searching unit in the implementation example illustrated in FIG. 12.

FIG. 20 is a block diagram of a time-domain winner take-all (TD-WTA) circuit 450 in the searching unit 350. In FIG. 20, C represents the number of columns of memory grains, N represents the dimension number of data, and C/N represents the number of pieces of reference data at each row of the memory.

The TD-WTA circuit 450 is a minimum searching circuit including a [sqrt] (C/N) layer composed of (C—N)/N 2-input time-domain comparators 451. The TD-WTA circuit 450 selects, as a local winner, a signal having a shortest delay (earliest rise) from among C/N TD voltage delay signals corresponding to C/N pieces of reference data input from the time-domain convertors in parallel, and outputs the signal together with the address of the winner.

The TD-WTA circuit 450 first inputs the C/N TD voltage delay signals to the 2-input TD comparator 451, compares each pair of the signals, and passes a signal having the shorter delay to the next layer. This process is repeated at several stages to search for a TD voltage delay signal (local winner) having the shortest delay. Each 2-input TD comparator 451 provides a flag to two input TD delay signals, stores the signals in an FF circuit 452, and encodes the flag to determine the address of reference data corresponding to the winner. Lastly, the TD-WTA circuit 450 outputs the local winner and the winner address thereof to a minimum comparing and updating circuit.

Figure 21:
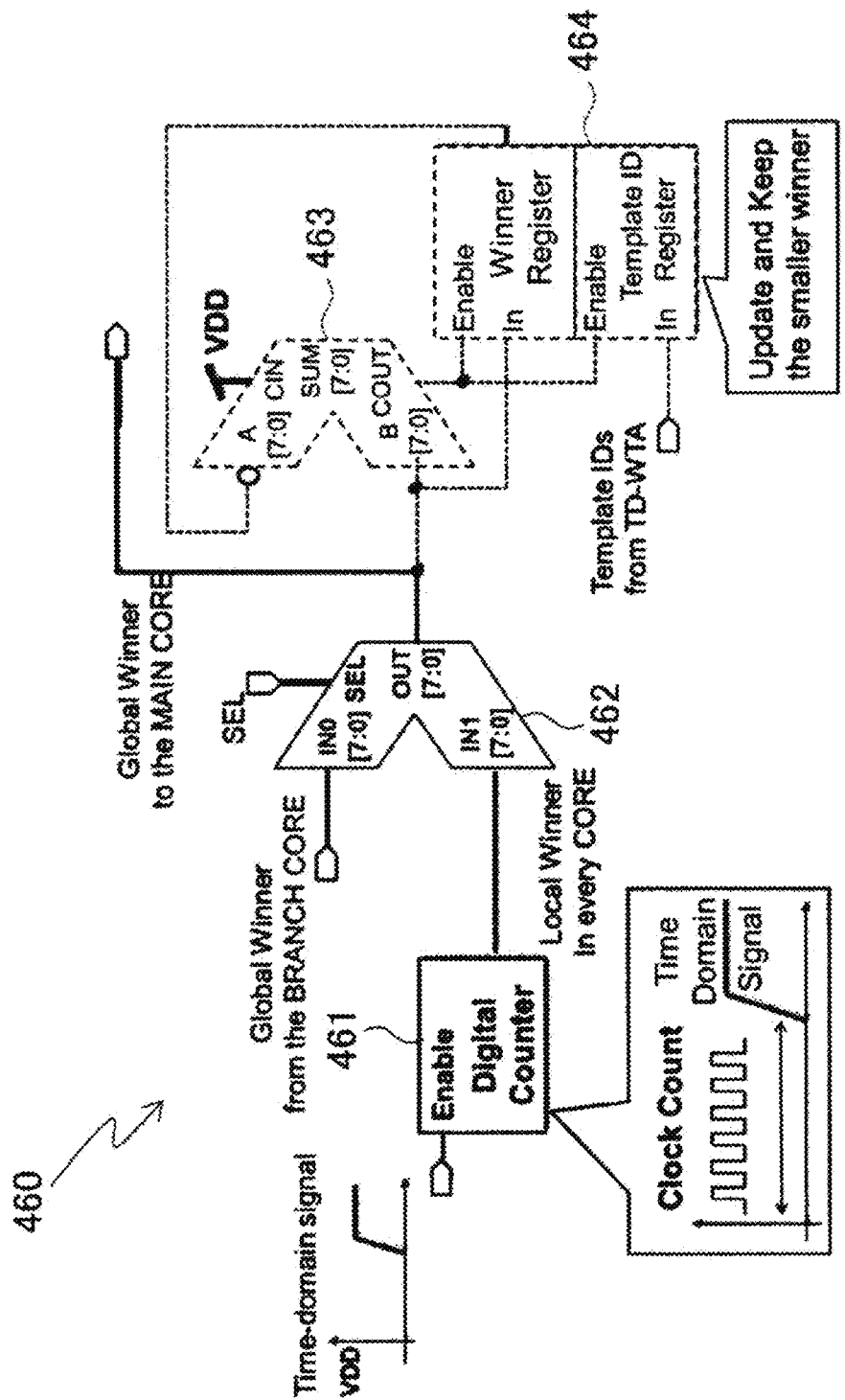
FIG. 21 is a configuration diagram of a minimum comparing and updating circuit in the implementation example illustrated in FIG. 12, which is used in a branch core.
Figure 22:
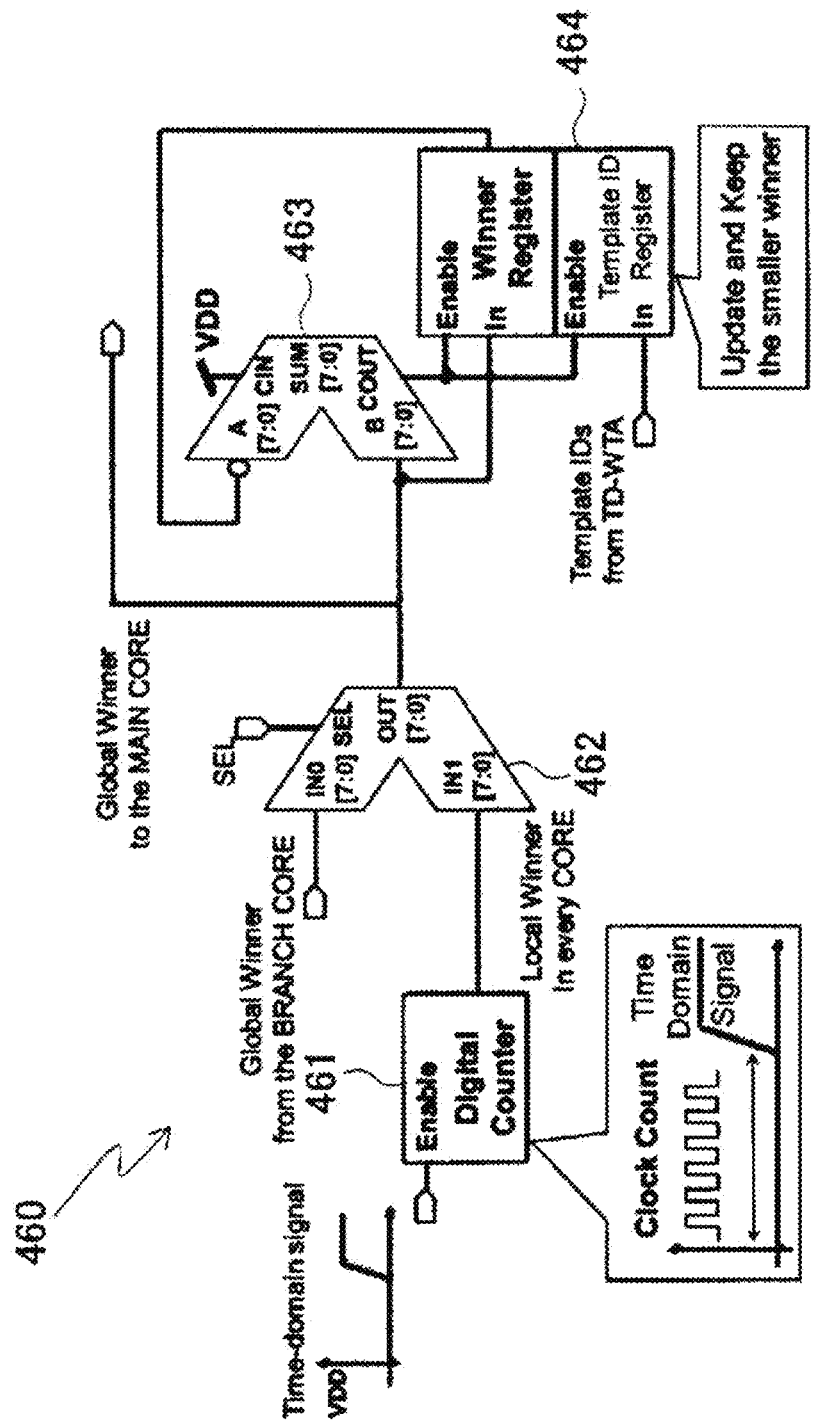
FIG. 22 is a configuration diagram of a minimum comparing and updating circuit in the implementation example illustrated in FIG. 12, which is used in a main core.

FIGS. 21 and 22 are each a configuration diagram of a minimum comparing and updating circuit 460. FIG. 21 illustrates the circuit used in a branch core, and FIG. 22 illustrates the circuit used in a main core. Any part illustrated with dotted lines is deactivated.

The minimum comparing and updating circuit 460 includes one W-bit digital counter 461, one W-bit selector 462, one W-bit digital adder 463, and a digital register 464 configured to store a global winner and the address thereof. The minimum comparing and updating circuit 460 compares each local winner input from the TD-WTA circuit 450 in series with a local winner determined at the previous step, and stores the smaller local winner, thereby determining a smallest global winner.

The minimum comparing and updating circuit 460 first receives the TD voltage delay signal of the local winner from the TD-WTA circuit 450, and converts a signal delay into the number of clocks through a digital counter of eight bits (W=8), thereby calculating the number of clocks (local minimum value) of the local winner. This conversion starts counting when the digital counter inputs a ramp voltage to a time-domain convertor, and is completed simultaneously with the calculation of the local winner by the TD-WTA circuit 450.

The branch core transfers the obtained local minimum value to the main core. The main core performs, by using the digital adder, subtraction processing on the local minimum value obtained from the main core or the branch core and the global winner (minimum value) stored in a winner register, and overwrites the register only in a case of COUT=1. While constantly updating the smaller global winner (minimum value) in this manner, the main core stores the final global minimum value and the corresponding reference data ID as an associative recognition result.

In the main core and each branch core, such processing is executed through the reference data storing circuit as the memory area, a data adaptive similarity evaluation circuit, and a two-level minimum searching circuit by a pipeline scheme at timings shifted from each other by one clock. Accordingly, associative recognition is completed on reference data at each row (C/N) of the core in one clock.

In the implementation example, a throughput of 8 data/clock is obtained. The system is easily scalable by using cores with the same design.

Figure 23A:
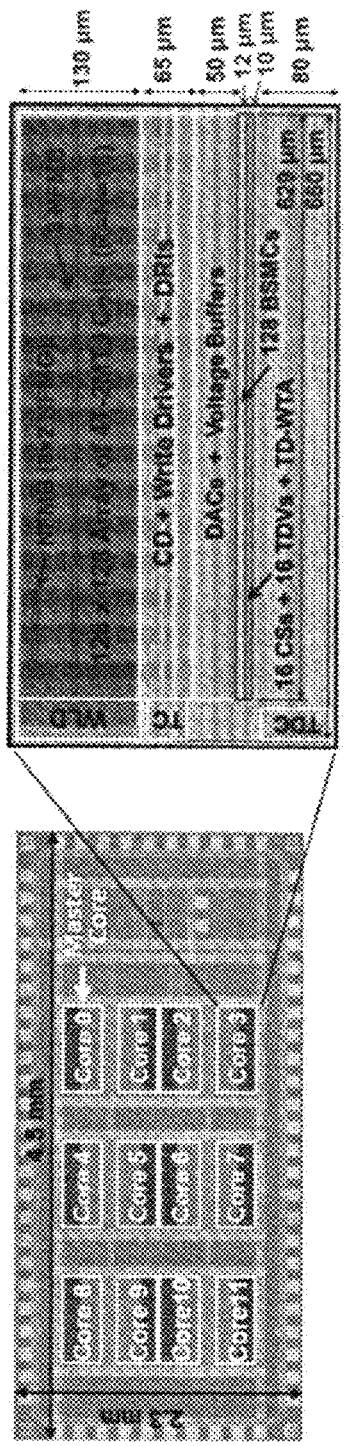
FIG. 23A is an image illustrating a picture of a chip produced according to designing specifications illustrated in FIG. 23C.
Figure 23B:
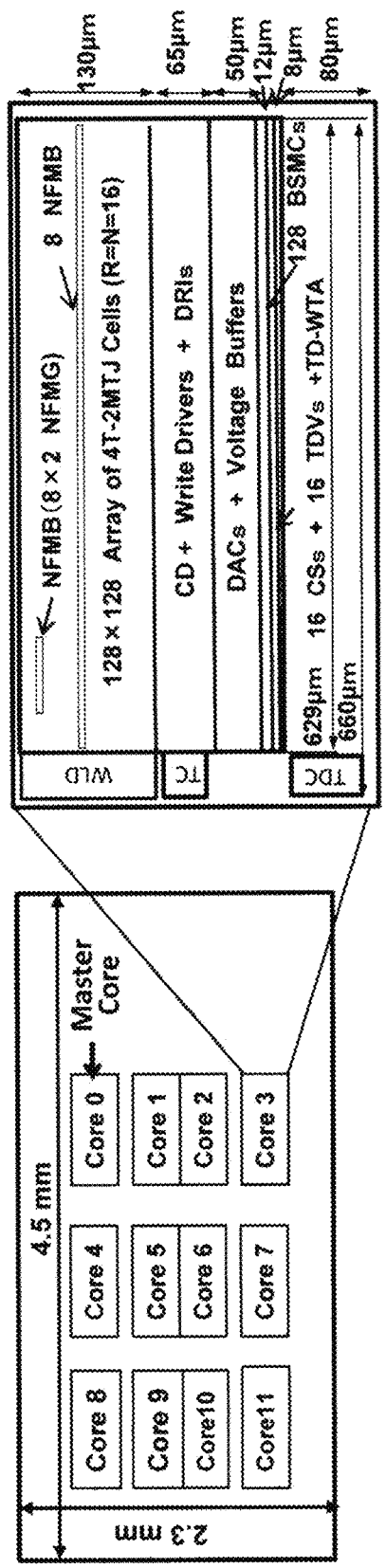
FIG. 23B is a pattern diagram of the image illustrated in FIG. 23A.

FIG. 23A illustrates a picture image of a chip produced in accordance with the design illustrated in FIG. 11. FIG. 23B schematically illustrates the image illustrated in FIG. 23A. FIG. 23C illustrates designing specifications.

Figure 24:
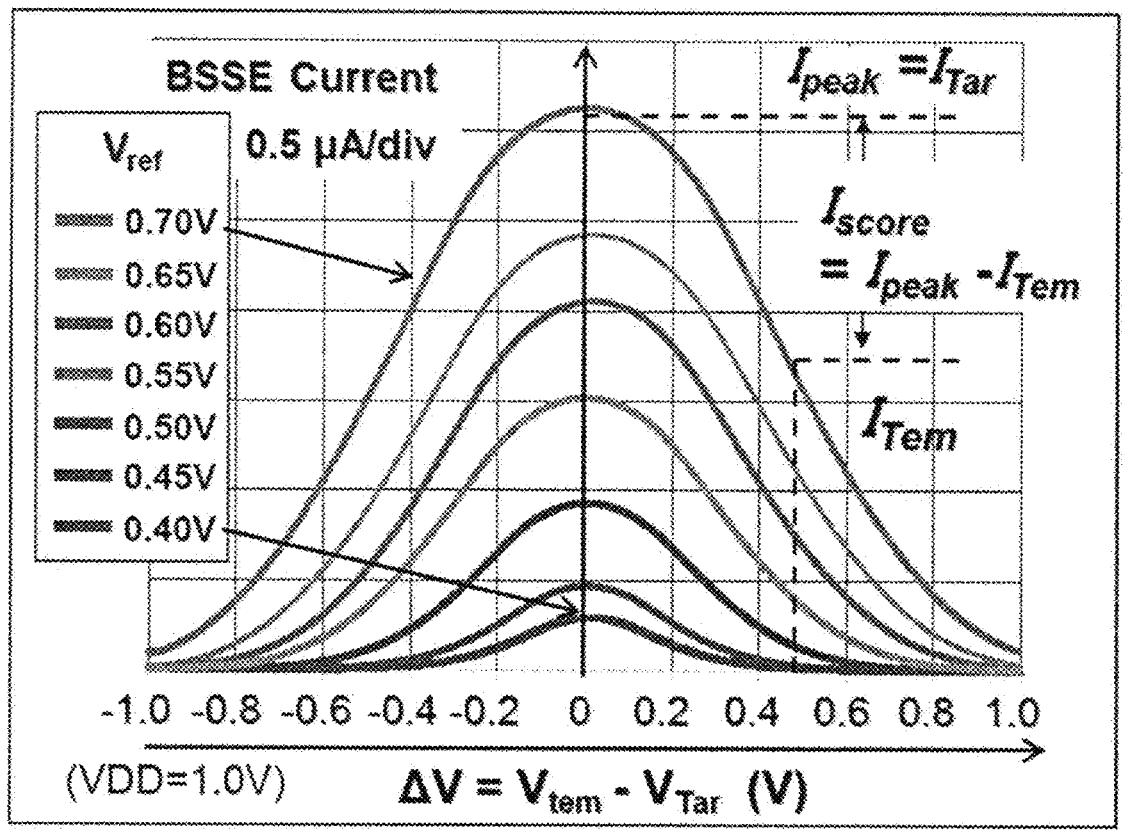
FIG. 24 is a diagram illustrating a test result of circuit operation of the similarity evaluation cell.

FIG. 24 is a diagram illustrating a test result of circuit operation of a similarity evaluation cell. The horizontal axis represents $\Delta V$ that is $V_{tem}-V_{Tar}$ illustrated in the CA of FIG. 18. The vertical axis represents currents $I_{peak}$ and $I_{tem}$. As illustrated in FIG. 24, similar bell-shaped waveforms are obtained irrespective of a reference voltage Vref.

Figure 25:
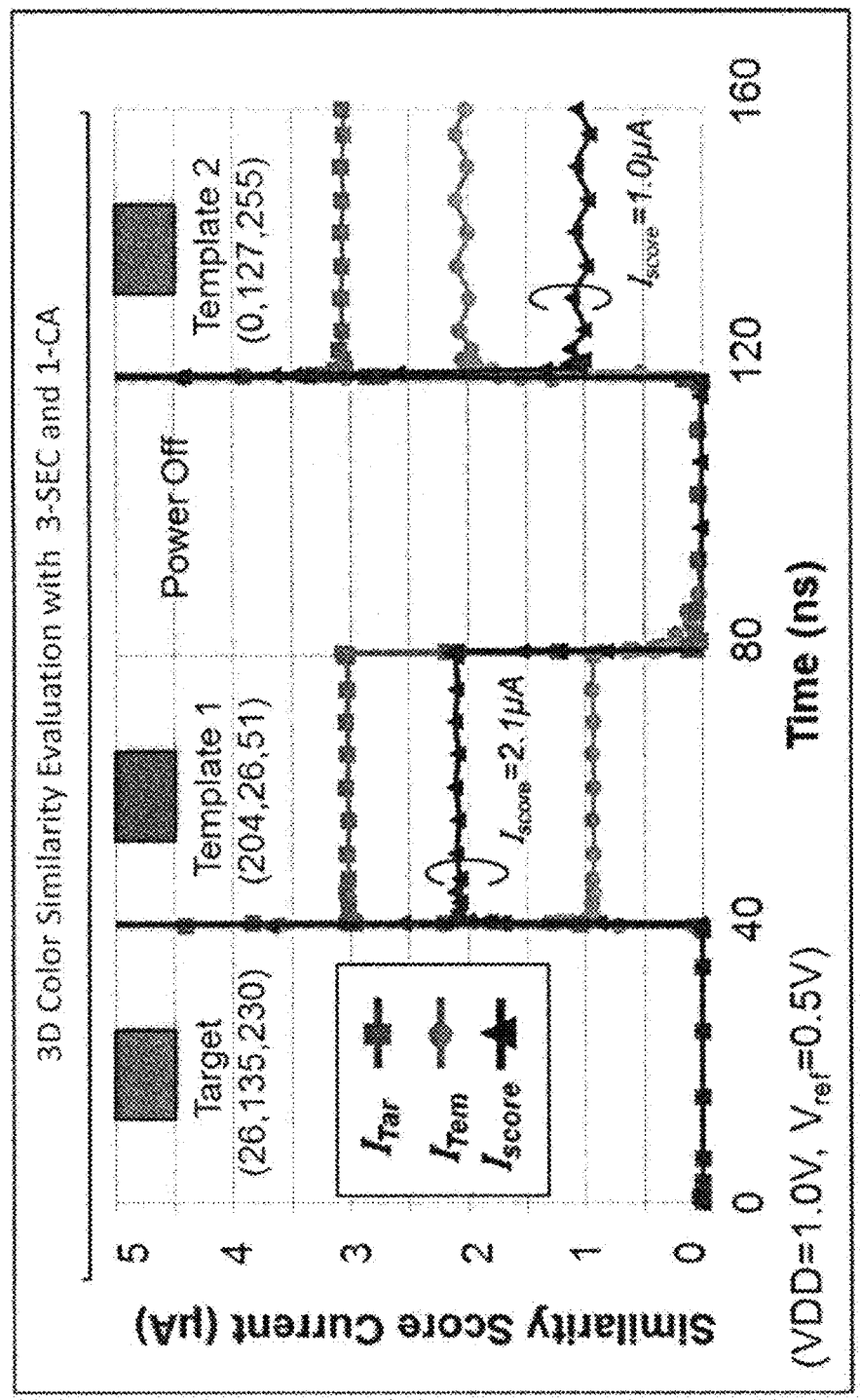
FIG. 25 is a diagram illustrating a result of similarity current in a three-dimensional data configuration.

FIG. 25 is a diagram illustrating a similarity current result output from the current accumulator in a three-dimensional color vector data (M=8 and N=3) configuration. As illustrated in FIG. 25, a lower similarity current ($I_{SCORE}$) is output for reference data (template) more similar to search data (target).

Figure 26:
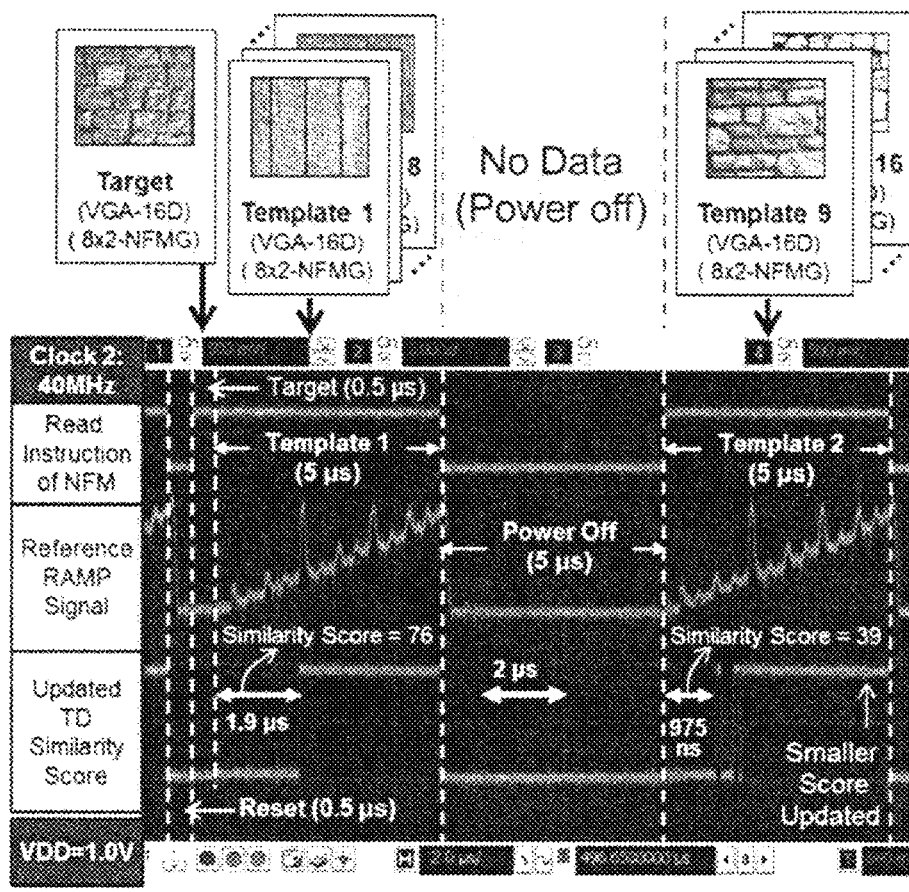
FIG. 26 is a diagram illustrating a core operation waveform in a 16-dimensional data configuration.

FIG. 26 is a diagram illustrating waveforms for testing core operation in a 16-dimensional data configuration, and is a verification result of texture recognition. The horizontal axis represents time, and the vertical axis represents a voltage of 0 V to 1 V. After the system is reset, as indicated by a data conversion command signal (read instruction of NFM) of D/A conversion, a "stone" texture as search data (Target) is input, and then eight "wooden board" textures as reference data (Template 1) at the first row are input. Then, after a power source is temporarily turned off, eight "stone" textures as reference data (Template 2) at the second row are input. While reference data is continuously input, current-mode similarity evaluation is performed, a similarity current is converted into a voltage TD delay signal by a ramp signal (reference ramp signal), and a TD delay signal (updated td similarity score) having a highest similarity is output from the voltage TD delay signal of the reference data at each row. Simultaneously, a delay of the output TD delay signal (updated TD similarity score) is converted into the number of clocks and obtained as a digital difference (similarity score), and updating with the smaller difference is performed, thereby achieving final texture associative recognition.

A prototype chip included 12 cores, operated at 40 MHz at a power voltage of 1 V, and completed recognition processing on data per row, in other words, C/N pieces of reference data in five microseconds. Resetting took 0.5 microseconds, and search data inputting took 0.5 microseconds. Other parameters were C=128, N=16, and R=8.

Figure 27:
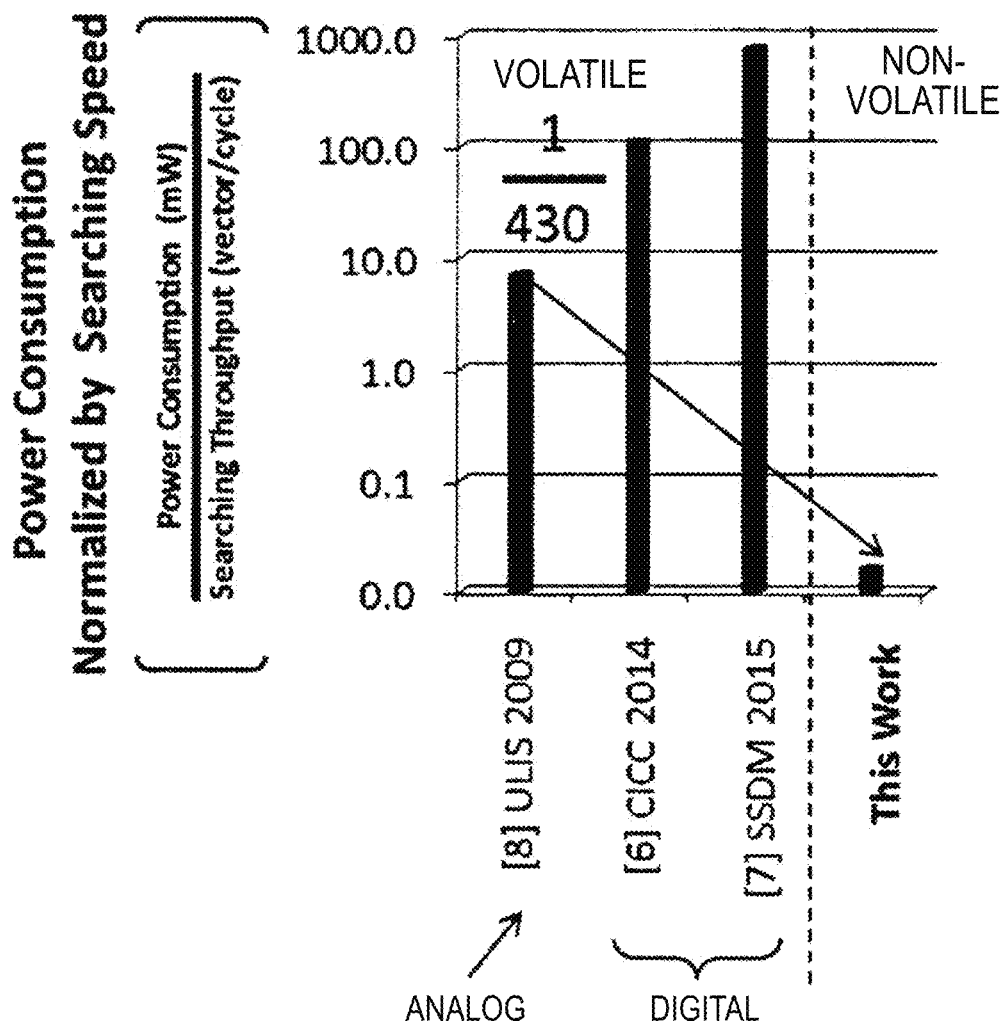
FIG. 27 is a diagram illustrating a comparison result of electric power consumption between the present implementation example and each of conventional analog and digital approaches.

FIG. 27 is a diagram illustrating a comparison result of electric power consumption between the conventional analog and digital approaches and the present implementation example. As illustrated in FIG. 27, electric power consumption is significantly reduced in the present implementation example.

Figure 28:
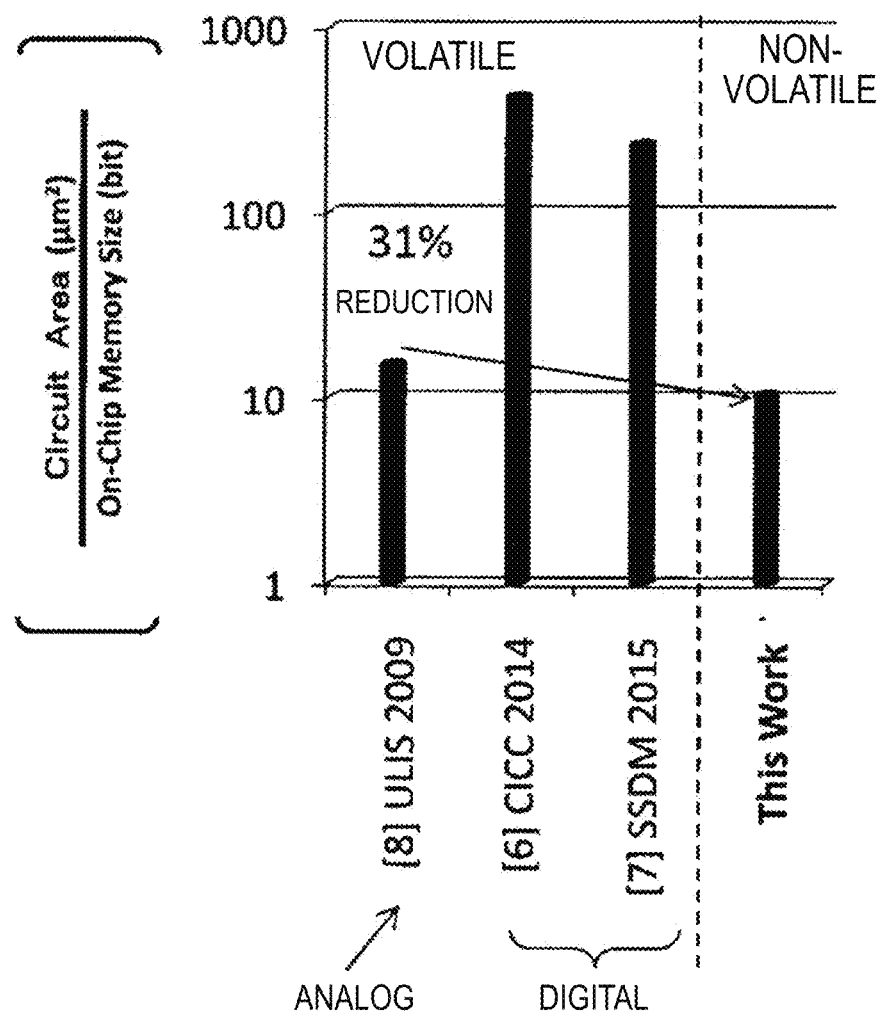
FIG. 28 is a diagram illustrating a comparison result of a circuit area between the present implementation example and each of the conventional analog and digital approaches.

FIG. 28 is a diagram illustrating a comparison result of a circuit area between the conventional analog and digital approaches and the present implementation example. As illustrated in FIG. 28, the circuit area is significantly reduced.

Although the embodiment of the present invention is described above, the present invention is characterized in the structure of a memory unit to reduce electric power consumption, and a similarity evaluate unit, a searching unit, and a comparing and updating unit may each have a specific circuit configuration that achieves contents of the embodiment of the present invention. The configurations illustrated in the drawings of FIG. 11 or later are merely preferable examples. The configuration may be that of a conventional associative memory, and in this case, the configuration needs to be modified as appropriate.

Although, in FIG. 3, each column line is a vertical line and each row line is a horizontal line in the above description, the column line is defined to be one of a line extending in one direction and a line extending in the other direction, and the row line is defined to be the other line. In other words, the column line is one of lines intersecting with each other, and the row line is the other line. This also applies to a configuration diagram illustrated in each drawing other than FIG. 3.

In the embodiment of the present invention, description of a nonvolatile memory is mainly made on an STT-MRAM, but the nonvolatile memory may be those listed below, for example. The nonvolatile memory may be a magnetoresistive random access memory (MRAM), a resistive random access memory (ReRAM), a ferroelectric random access memory (FeRAM), a flash memory, or the like.

The magnetoresistive random access memory is a nonvolatile memory exploiting spintronics and based on the operation principle of a giant magneto resistive effect (GMR effect). For example, the magnetoresistive random access memory is selected from a domain wall displacement MRAM, a spin hole torque MRAM, and a spin transfer torque MRAM (STT-RMAM). The domain wall displacement MRAM is a three-terminal MRAM in which magnetization is inverted by traveling through the domain wall of a minute magnetic body. The spin hole torque MRAM is a three-terminal MRAM in which magnetization is inverted by spin hole torque from a non-magnetic body. The STT-RMAM is a two-terminal MRAM in which magnetization is rotated through a mutual effect with electron spin by causing current to flow to a magnetic body. Each memory is expected to achieve a high density, a fast speed, and a long lifetime.

The resistive random access memory is a nonvolatile memory configured to store data by utilizing change of electric resistance in metallic oxide due to voltage application. The resistive random access memory is expected to achieve a high density and a high speed.

The ferroelectric random access memory is a nonvolatile memory configured to store data by utilizing positive and negative residual polarization due to a ferroelectric hysteresis effect. The ferroelectric random access memory is expected to achieve a high speed and a long lifetime.

The flash memory is a nonvolatile memory configured to store data by trapping, under voltage control, electric charge in a MOS floating gate to change a MOS threshold. The flash memory is expected to achieve a high density.

In the embodiment of the present invention, low electric power consumption can be achieved at data reading from a memory grain by power gating, and equivalent low electrical power consumption can be achieved at writing by flexibly optimized electrical power supply.

REFERENCE SIGNS LIST

10: search data
20: feature vector data
30: reference data
100: memory device
110: memory unit (reference data storing circuit)
111: row decoder
112: column decoder
113: memory area
114: read/write circuit
115: row line
116: bit line
117: column line
118: power driver
119: memory grain
130: similarity evaluating unit
131: input search data storing circuit
132: digital/analog convertor (DAC)
133: similarity evaluation cell (SEC)
134: switch
134a: first switch
134b: second switch
134c: NOT circuit
135: current accumulator (CA)
136: time-domain convertor (TDC)
150: searching unit
151: time-domain minimum searching circuit
170: comparing and updating unit
171: minimum comparing and updating circuit
200: memory system
210: main core
211: output buffer
212: minimum comparing and updating circuit
220: branch core
221: output buffer
222: minimum comparing and updating circuit
230: pipeline
300: memory device 310: memory unit
311: row decoder
312: column decoder
313: memory area
314: read/write circuit
315: row line
316: bit line
317: column line
318: power driver
319: memory grain
320: 4T-2MTJ memory cell
321 to 324: N-type MOSFET
325, 326: MTJ
327: WRI circuit
327A: write driver circuit
327B: pre-charge circuit
327C: sense amplifier circuit
327D: digital register (Register) circuit
330: similarity evaluating unit
332: digital/analog convertor (DAC)
333: similarity evaluation cell (SEC)
334: switch
334a: first switch
334b: second switch
334c: NOT circuit
335: current accumulator (CA)
336: time-domain convertor (TDC)
350: searching unit
351: time-domain minimum searching circuit
370: comparing and updating unit
371: minimum comparing and updating circuit

The invention claimed is:

1. A memory device comprising a memory area configured to store reference data of N (≥1) dimensions, each dimension composed of M (≥1) bits, wherein
memory grains and power drivers paired with the memory grains and configured to supply electrical power to the memory grains are provided in each region specified by column lines in the number being one to N inclusive and M row lines in the memory area, and
the reference data per dimension stored in the memory grain paired with each power driver is read when the power driver receives inputting of a control signal from the corresponding one of the column lines, inputting of a control signal from the corresponding one of the M row lines, and inputting of a clock signal, and supplies electrical power to the memory grain in synchronization with the clock signal.

2. The memory device according to claim 1, wherein
the memory area is specified by an optional number of column lines and M row lines, and
each memory grain comprises nonvolatile memories of M bits as one unit, and the number is optional, and
the power driver supplies electrical power to an optional number of memory grains.

3. The memory device according to claim 2, wherein the inputting of control signals from the M row lines is sequentially performed for each set of row lines in a predetermined number of one to M.

4. The memory device according to claim 2, wherein the inputting of control signals from the M row lines is simultaneously performed.

5. The memory device according to claim 2, wherein each power driver does not supply electrical power to the corresponding set of the memory grains in the optional number that is paired with the power driver when having received inputting of a clock signal of "1", and supplies electrical power to the corresponding one of the memory grains in the optional number that is paired with the power driver to read the reference data stored in the memory grain when having received inputting of a clock signal of "0".

6. The memory device according to claim 2, wherein each power driver does not supply electrical power to the corresponding set of the memory grains in the optional number that is paired with the power driver when having received inputting of a clock signal of "0", and supplies electrical power to the corresponding one of the memory grains in the optional number that is paired with the power driver to read the reference data stored in the memory grain when having received inputting of a clock signal of "1".

7. The memory device according to claim 2, wherein the nonvolatile memory is a magnetoresistive random access memory, a resistive random access memory, a ferroelectric random access memory, or a flash memory.

8. The memory device according to claim 1, wherein
the memory area is composed of a memory array in an (R×M)×C matrix, including (R×M) row lines and C column lines, and configured to store (R×C)/N pieces of reference data of an optional number N (2≤N≤C) of dimensions, each dimension composed of M (≥2) bits, each memory grain composed of M nonvolatile memory cells as one unit and a power driver paired with the memory grain and configured to supply electrical power to the memory grain, and including a power line gate per row are provided in each region specified by one of the column lines and M of the row lines in the memory area, and
the power driver supplies electrical power to the memory grain in synchronization with the clock signal, when the power driver receives inputting of the control signal from the one column line, inputting of the control signals from the row lines at a corresponding row among the M row lines, and inputting of the clock signal.

9. The memory device according to claim 8, wherein control signals from the M row lines are sequentially input one by one.

10. The memory device according to claim 8, wherein while a control signal input from a column line and a control signal input from a row line are activated, each power driver does not supply electrical power to the memory grain paired with the power driver when having received inputting of a clock signal of "1", and supplies electrical power to the memory grain paired with the power driver to read the reference data stored in the memory grain when having received inputting of a clock signal of "0".

11. The memory device according to claim 8, wherein while a control signal input from a column line and a control signal input from a row line are activated, each power driver does not supply electrical power to the memory grain paired with the power driver when having received inputting of a clock signal of "0", and supplies electrical power to the memory grain paired with the power driver to read the reference data stored in the memory grain when having received inputting of a clock signal of "1".

12. The memory device according to claim 8, wherein the nonvolatile memory cell is a magnetoresistive random access memory cell, a resistive random access memory cell, or a ferroelectric random access memory cell.

13. The memory device according to claim 1, wherein
the memory area is composed of a memory array in an (R×M)×C matrix, including (R×M) row lines and C column lines, and configured to store (R×C)/N pieces of reference data of an optional number N (2≤N≤C) of dimensions, each dimension composed of M (≥2) bits, the memory grain composed of M nonvolatile memory cells as one unit and a power driver paired with the memory grain and configured to supply electrical power to the memory grain are provided in each region specified by one of the column lines and M of the row lines in the memory area, and the power driver supplies electrical power to the memory grain in synchronization with the clock signal, when the power driver receives inputting of the control signal from the one column line, inputting of the control signal from one of the M row lines, and inputting of the clock signal.

14. The memory device according to claim 13, wherein control signals from the M row lines are sequentially input one by one.

15. The memory device according to claim 13, wherein while a control signal input from a column line and a control signal input from a row line are activated, each power driver does not supply electrical power to the memory grain paired with the power driver when having received inputting of a clock signal of "1", and supplies electrical power to the memory grain paired with the power driver to read the reference data stored in the memory grain when having received inputting of a clock signal of "0".

16. The memory device according to claim 13, wherein while a control signal input from a column line and a control signal input from a row line are activated, each power driver does not supply electrical power to the memory grain paired with the power driver when having received inputting of a clock signal of "0", and supplies electrical power to the memory grain paired with the power driver to read the reference data stored in the memory grain when having received inputting of a clock signal of "1".

17. The memory device according to claim 13, wherein the nonvolatile memory cell is a magnetoresistive random access memory cell, a resistive random access memory cell, or a ferroelectric random access memory cell.

18. The memory device according to claim 1, wherein the memory area is composed of a memory array in an (R×M)×C matrix, including (R×M) row lines and C column lines, and configured to store (R×C)/N pieces of reference data of an optional number N (2≤N≤C) of dimensions, each dimension composed of M (≥2) bits, wherein K memory grains each composed of M nonvolatile memory cells and power drivers paired with the memory grains, configured to supply electrical power to the memory grains, and including a power line gate per row are provided in each region specified by one of the column lines and M of the row lines in the memory area, and the power driver supplies electrical power to the memory grain in synchronization with the clock signal, when the power driver receives inputting of the control signal from the one column line, inputting of the control signals from the row lines at a corresponding row among the M row lines, and inputting of the clock signal.

19. The memory device according to claim 11, wherein control signals from the M row lines are sequentially input one by one.

20. The memory device according to claim 11, wherein while a control signal input from a column line and a control signal input from a row line are activated, each power driver does not supply electrical power to the memory grain paired with the power driver when having received inputting of a clock signal of "1", and supplies electrical power to the memory grain paired with the power driver to read the reference data stored in the memory grain when having received inputting of a clock signal of "0".

21. The memory device according to claim 11, wherein while a control signal input from a column line and a control signal input from a row line are activated, each power driver does not supply electrical power to the memory grain paired with the power driver when having received inputting of a clock signal of "0", and supplies electrical power to the memory grain paired with the power driver to read the reference data stored in the memory grain when having received inputting of a clock signal of "1".

22. The memory device according to claim 18, wherein the nonvolatile memory cell is a magnetoresistive random access memory cell, a resistive random access memory cell, or a ferroelectric random access memory cell.

23. The memory device according to claim 1, further comprising:
a first circuit configured to calculate a similarity between each read reference data per dimension and search data per dimension at each reading from the memory area; and
a second circuit configured to determine a candidate having a high similarity among the similarities calculated by the first circuit and calculate the similarity of most similar reference data per dimension at the reading from the memory area.

* * * * *